(12) United States Patent
Jeon et al.

(10) Patent No.: US 11,797,140 B2
(45) Date of Patent: Oct. 24, 2023

(54) TOUCH SENSING UNIT AND DISPLAY DEVICE INCLUDING THE SAME

(71) Applicant: Samsung Display Co., Ltd., Yongin-Si (KR)

(72) Inventors: Hyun Jee Jeon, Anam-si (KR); Sang Hyun Lim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/681,122

(22) Filed: Feb. 25, 2022

(65) Prior Publication Data
US 2023/0036586 A1    Feb. 2, 2023

(30) Foreign Application Priority Data
Aug. 2, 2021  (KR) .................. 10-2021-0101316

(51) Int. Cl.
*G06F 3/044* (2006.01)
*H10K 59/40* (2023.01)
*H10K 59/122* (2023.01)

(52) U.S. Cl.
CPC .......... *G06F 3/0446* (2019.05); *G06F 3/0448* (2019.05); *H10K 59/122* (2023.02); *H10K 59/40* (2023.02)

(58) Field of Classification Search
CPC ... G06F 3/0446; G06F 3/0448; H01L 27/323; H01L 27/3246

USPC ........................................................ 345/173
See application file for complete search history.

(56) References Cited

U.S. PATENT DOCUMENTS

| | | | | |
|---|---|---|---|---|
| 2018/0182818 A1* | 6/2018 | Kim | ...................... | H10K 59/40 |
| 2019/0051708 A1* | 2/2019 | Jeong | ................ | H10K 50/8445 |
| 2019/0073976 A1* | 3/2019 | Yeh | ........................ | H01L 27/124 |
| 2021/0048907 A1* | 2/2021 | Rhe | ........................ | G06F 3/0418 |
| 2021/0327965 A1* | 10/2021 | He | ........................ | G06F 3/0446 |

FOREIGN PATENT DOCUMENTS

| | | | | |
|---|---|---|---|---|
| CN | 109064897 A | * | 12/2018 | ......... G02F 1/13338 |
| CN | 109064897 A | | 12/2018 | |
| KR | 2017-0034999 A | | 3/2017 | |
| KR | 2021-0029062 A | | 3/2021 | |

* cited by examiner

*Primary Examiner* — Mark Edwards
(74) *Attorney, Agent, or Firm* — Innovation Counsel LLP

(57) ABSTRACT

Provided is a touch sensing unit comprises a first sensor group extending in a first direction and including a plurality of sensor electrodes; a second sensor group extending in the first direction and including the plurality of sensor electrodes; a first peripheral electrode electrically connected to the first sensor group; and a second peripheral electrode electrically connected to the second sensor group, wherein an area of the first sensor group is smaller than an area of the second sensor group in a plan view, and an area of the first peripheral electrode is greater than an area of the second peripheral electrode in the plan view.

20 Claims, 22 Drawing Sheets

TOUCH SENSING UNIT AND DISPLAY DEVICE INCLUDING THE SAME

CROSS-REFERENCE TO RELATED APPLICATION

This application claims priority from Korean Patent Application No. 10-2021-0101316 filed on Aug. 2, 2021 in the Korean Intellectual Property Office, the disclosure of which is incorporated herein by reference in its entirety.

BACKGROUND

1. Field of the Disclosure

The present disclosure relates to a touch sensing unit and a display device including the same. More particularly, the present disclosure relates to a touch sensing unit capable of increasing the accuracy of touch sensing and a display device including the same.

2. Description of the Related Art

As the information-oriented society evolves, various demands for display devices are ever increasing. For example, display devices are being employed by a variety of electronic devices such as smart phones, digital cameras, laptop computers, navigation devices, smart watches, and smart televisions. Display devices may be flat panel display devices such as a liquid-crystal display device, a field emission display device, and an organic light-emitting display device.

A touch sensing unit that recognizes a touch input has been widely employed as the input means of a display device for a smartphone or a tablet PC. The touch sensing unit determines whether a user's touch input is received using a plurality of sensor electrodes, and, if any, finds the coordinates of the position of the touch input.

Sensor groups including a plurality of sensor electrodes may have different areas depending on the shape of the display device when viewed from the top. For example, when a display device has a circular shape when viewed from the top, sensor groups may have different areas. The parasitic capacitance of a sensor group may increase with the area of the sensor group. Accordingly, there may be a difference in a touch sensing signal depending on the area of the sensor groups. When this happens, a user's touch may not be sensed, or a touch may be recognized erroneously even though there was not any.

SUMMARY

Aspects of the disclosure provide a touch sensing unit capable of increasing the accuracy of touch sensing by reducing a difference between areas of sensor groups including sensor electrodes.

Aspects of the disclosure also provide a display device capable of increasing the accuracy of touch sensing by reducing a difference between areas of sensor groups including sensor electrodes.

It should be noted that objects of the disclosure are not limited to the above-mentioned object; and other objects of the disclosure will be apparent to those skilled in the art from the following descriptions.

According to the embodiments of the disclosure, a touch sensing unit comprises a first sensor group extending in a first direction and including a plurality of sensor electrodes, a second sensor group extending in the first direction and including the plurality of sensor electrodes, a first peripheral electrode electrically connected to the first sensor group, and a second peripheral electrode electrically connected to the second sensor group, wherein an area of the first sensor group is smaller than an area of the second sensor group in a plan view, and wherein an area of the first peripheral electrode is greater than an area of the second peripheral electrode in the plan view.

The touch sensing unit may comprise a plurality of auxiliary electrodes overlapping the first peripheral electrode and the second peripheral electrode, and an auxiliary line connecting to at least one of the plurality of auxiliary electrodes.

The touch sensing unit may comprise a third sensor group extending in the first direction and including the plurality of sensor electrodes, and a third peripheral electrode electrically connected to the third sensor group, wherein the area of the second sensor group is smaller than an area of the third sensor group in the plan view, and wherein the area of the second peripheral electrode is larger than an area of the third peripheral electrode in the plan view.

The touch sensing unit may comprise a third sensor group extending in the first direction, including the plurality of sensor electrodes, and having a largest area, and wherein a number of a plurality of peripheral electrodes including the first peripheral electrode and the second peripheral electrode is less than a number of the plurality of sensor groups comprising the first sensor group, the second sensor group and the third sensor group in the plan view.

A length of the second sensor group in the first direction may be larger than a length of the first sensor group in the first direction.

The touch sensing unit may comprise a touch sensing area in which the first sensor group and the second sensor group are disposed, and a touch peripheral area in which the first peripheral electrode, the second peripheral electrode, the plurality of auxiliary electrodes, and the auxiliary line are disposed.

The auxiliary line may be connected to all of the plurality of auxiliary electrodes.

The auxiliary line may comprise a first auxiliary line connected to one of the plurality of auxiliary electrodes which overlaps the first peripheral electrode, and a second auxiliary line connected to one of the plurality of auxiliary electrodes which overlaps the second peripheral electrode.

The touch sensing unit may comprise a first connecting electrode connecting the first sensor group with the first peripheral electrode, and a second connecting electrode connecting the second sensor group with the second peripheral electrode, wherein a length of the first connecting electrode is longer than a length of the second connecting electrode.

At least one of the first peripheral electrode and the second peripheral electrode may be disposed in a winding shape.

Each of the first sensor group and the second sensor group may include a plurality of sensor electrodes having a mesh shape, and wherein the first peripheral electrode and the second peripheral electrode have a planar shape.

According to another embodiment of the disclosure, a touch sensing unit comprises a first driving group including a plurality of driving electrodes extending in a first direction, a first sensing group including a plurality of sensing electrodes extending in a second direction crossing the first direction, a first driving peripheral electrode electrically connected to the first driving group, a first sensing peripheral electrode electrically connected to the first sensing group, a plurality of auxiliary electrodes overlapping the first driving peripheral electrode and the first sensing peripheral electrode, and a first auxiliary line connected to at least one of the plurality of auxiliary electrodes.

The touch sensing unit may comprise a second auxiliary line connected to at least another one of the plurality of auxiliary electrodes.

The touch sensing unit may comprise a touch sensing area in which the first driving group and the first sensing group are disposed, and a touch peripheral area in which the first peripheral electrode, the first sensing peripheral electrode, and the first auxiliary line are disposed.

The touch sensing area may include a second driving group extending in the first direction and having the plurality of driving electrodes, and a second sensing group extending in the second direction and comprising the plurality of sensing electrodes, wherein the touch peripheral area includes a second driving peripheral electrode electrically connected to the second driving group, and a second sensing peripheral electrode electrically connected to the second sensing group, wherein an area of the second driving group is larger than an area of the first driving group, and an area of the second sensing group is larger than an area of the first sensing group in a plan view, and wherein an area of the second driving peripheral electrode is smaller than an area of the first driving peripheral electrode, and an area of the second sensing peripheral electrode is smaller than an area of the first sensing peripheral electrode in the plan view.

The touch sensing unit may comprise a third sensing group extending in the second direction and including the plurality of sensing electrodes, and a third sensing peripheral electrode electrically connected to the third sensing group, wherein an area of the third sensing group is greater than an area of the second sensing group, and an area of the third sensing peripheral electrode is smaller than an area of the second sensing peripheral electrode, and wherein the first driving peripheral electrode is disposed between the third sensing peripheral electrode and the second sensing peripheral electrode.

According to embodiments of the disclosure, a display device comprises a substrate including a touch sensing area and a touch peripheral area disposed around the touch sensing area, an anode electrode disposed on the substrate, a pixel-defining film having an opening exposing the anode electrode, an emission layer disposed in the opening of the pixel-defining film on the anode electrode, a cathode electrode disposed on the emission layer, an encapsulation layer disposed on the cathode electrode, a first touch conductive layer disposed on the encapsulation layer, a first touch insulating layer disposed on the first touch conductive layer, and a second touch conductive layer disposed on the first touch insulating layer, wherein the first touch conductive layer includes a plurality of auxiliary electrodes disposed in the touch peripheral area, and wherein the second touch conductive layer includes a first sensor group and a second sensor group having a plurality of sensor electrodes extended in a direction in the touch sensing area, and a first peripheral electrode and a second peripheral electrode overlapping the plurality of auxiliary electrodes in the touch peripheral area.

A display device may comprise an auxiliary line connecting the auxiliary electrodes with one another, wherein a voltage applied to the auxiliary line is equal to a voltage applied to the cathode electrode.

A display device may comprise an auxiliary line connecting the auxiliary electrodes with one another, wherein a ground voltage is applied to the auxiliary line.

An area of the first sensor group may be greater than an area of the second sensor group in a plan view, and wherein an area of the first peripheral electrode is smaller than an area of the second peripheral electrode in the plan view.

According to embodiments of the disclosure, each of sensor groups may be connected to a peripheral electrode overlapping an auxiliary electrode except a sensor group having the largest parasitic capacitance in a touch sensing unit in a display device. Accordingly, each of the sensor groups may have a capacitance equal to the sum of a parasitic capacitance and a compensating capacitance. Therefore, it is possible to minimize or reduce a difference between the parasitic capacitance of the sensor group having the largest parasitic capacitance and the capacitance of each of the other sensor groups. Accordingly, it is possible to prevent a difference in the touch sensing signal due to a difference in parasitic capacitance depending on the areas of the sensing groups. Accordingly, it is possible to increase the accuracy of touch sensing.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Hereinafter, embodiments of the disclosure will be described with reference to the accompanying drawings.

Figure 1:
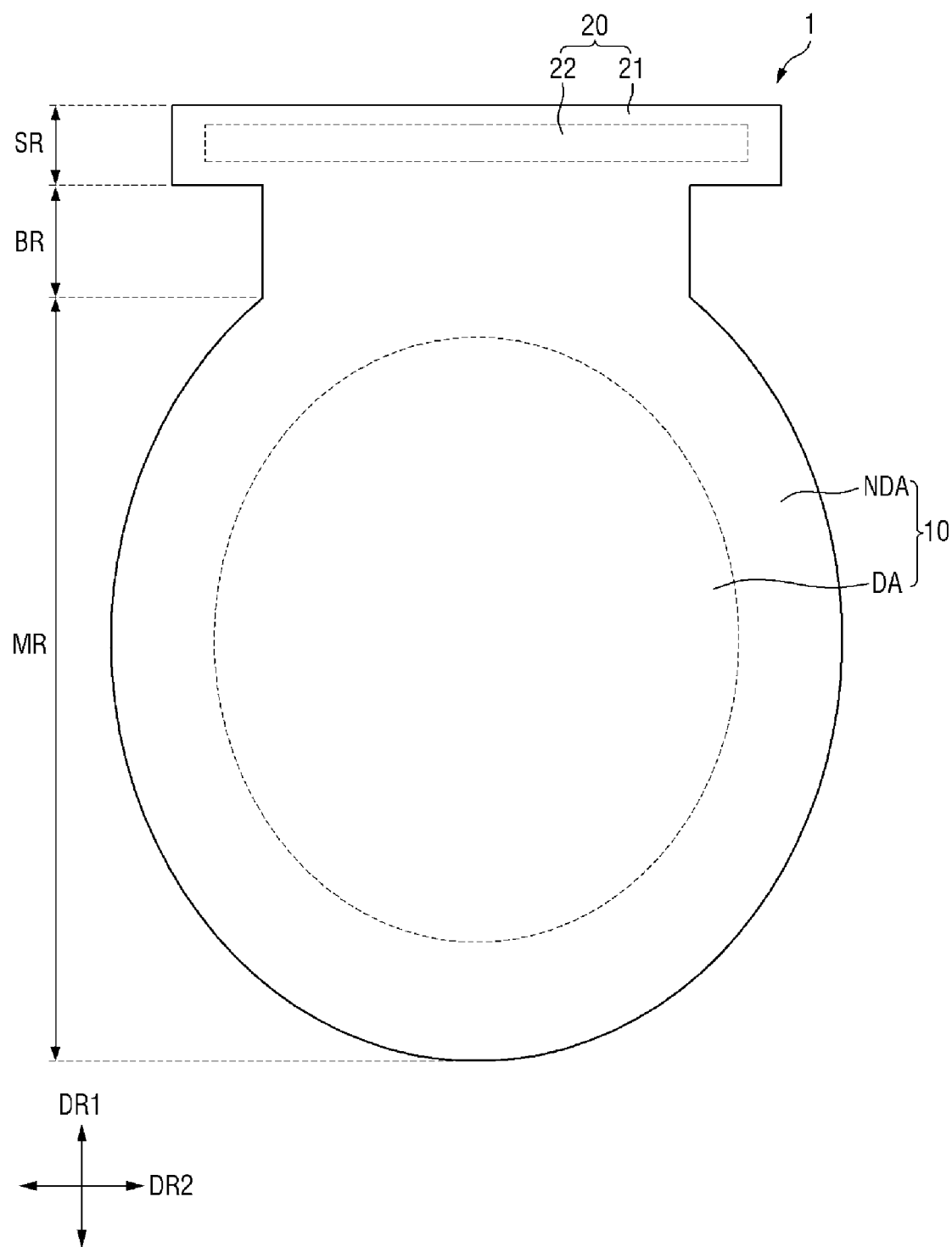
FIG. 1 is a plan view of a display device according to an embodiment of the disclosure.
Figure 2:
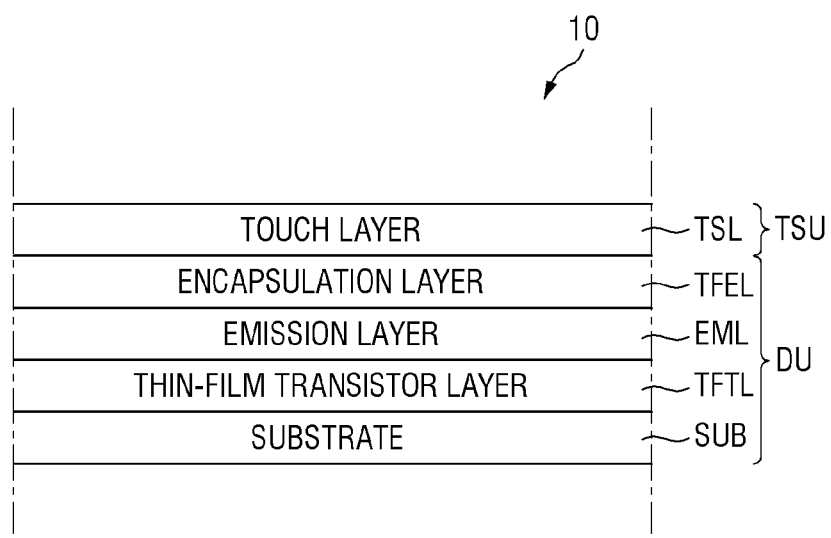
FIG. 2 is a cross-sectional view of a display panel according to an embodiment of the disclosure.

FIG. 1 is a plan view of a display device according to an embodiment of the disclosure. FIG. 2 is a cross-sectional view of a display panel according to an embodiment of the disclosure.

According to embodiments, a first direction DR1 and a second direction DR2 are different directions and they may intersect each other. The first direction DR1 may be the vertical direction of the display device 1, and the second direction DR2 may be the horizontal direction of the display device 1. It should be understood, however, that embodiments of the disclosure are not limited thereto. In the following description, a first side of the first direction DR1 indicates the upper side, a second side of the first direction DR1 indicates the lower side, a first side of the second direction DR2 indicates the left side, and a second side of the second direction DR2 indicates the right side when viewed from the top. It should be understood that the directions referred to in the embodiments are relative directions, and the embodiments are not limited to the directions mentioned.

Referring to FIGS. 1 and 2, a display device 1 may include a variety of electronic devices providing a display screen. Examples of the display device 1 include, but are not limited to, a mobile phone, a smart phone, a tablet PC, a mobile communications terminal, an electronic organizer, an e-book, a personal digital assistant (PDA), a portable multimedia player (PMP), a navigation device, an ultra mobile PC (UMPC), a television set, a game machine, a wristwatch-type electronic device, a head-mounted display, a personal computer monitor, a laptop computer, a vehicle instrument cluster, a digital camera, a camcorder, an outdoor billboard, an electronic billboard, various medical apparatuses, various inspection devices, various home appliances including a display area such as a refrigerator and a laundry machine, Internet of things (IoT) devices, etc.

At least a part of the display device 1 may have a circular shape when viewed from the top. It should be understood, however, that the disclosure is not limited thereto. The display device 1 may have a polygonal shape such as a quadrangle, a triangle, a diamond and a trapezoid when viewed from the top.

The display device 1 may include a display panel 10 and a panel driver 20.

The display panel 10 may include a display area DA where images are displayed, and a non-display area NDA where no image is displayed. The display area DA may include a plurality of pixels PX for displaying images (see FIG. 5), and the non-display area NDA may be disposed around the display area DA.

The display area DA may overlap a touch sensing area TSA (see FIG. 3) in which a touch input is sensed, which will be described later. The display area DA may have a non-rectangular shape. The non-rectangular shape may be, for example, a polygon such as a circular shape, an elliptical shape, a partially circular polygon, and a rectangular shape with rounded corners. According to this embodiment, the display area DA has a circular shape when viewed from the top as an example.

The non-display area NDA may be formed around the display area DA. The non-display area NDA may surround the display area DA. In the non-display area NDA, signal lines or driving circuits 22 for applying signals to the display area DA or touch sensing area TSA may be disposed.

The display panel 10 may include a main region MR, a bending region BR at which the display panel 10 is bent, and a subsidiary region SR protruding from the bending region BR. The main region MR may have a shape generally similar to the appearance of the display device 1 when viewed from the top. At least a part of the main region MR may have a circular shape when viewed from the top.

The main region MR may include the display area DA. The display area DA may be disposed in the main region MR. According to an embodiment of the disclosure, the part of the main region MR around the edge of the display area DA and the entire subsidiary region SR may be the non-display area NDA. It is, however, to be understood that the disclosure is not limited thereto. At least a part of the bending region BR or the subsidiary region SR may also include the display area DA.

The display panel 10 may be divided into the main region MR located on the second side of the bending region BR in the first direction DR1, and the subsidiary region SR located on the first side of the bending region BR in the first direction DR1. That is, the main region MR is located below the bending region BR, and the subsidiary side DR is located above the bending region BR as shown in FIG. 1.

The bending region BR and subsidiary region SR may protrude from the main region MR toward the first side of the first direction DR1. The bending region BR and subsidiary region SR may have, but is not limited to, a rectangular shape when viewed from the top.

The panel driver 20 may be disposed in the non-display area NDA of the display panel 10. The panel driver 20 may include a driving circuit 22 and a circuit board 21.

The driving circuit 22 may be disposed in the subsidiary region SR and may be mounted on the circuit board 21. The driving circuit 22 may output signals and voltages for driving the display panel 10. The driving circuit 22 may be implemented as an integrated circuit (IC) for display and/or an integrated circuit (IC) for touch sensing.

The circuit board 21 may be attached on the pads of the display panel 10 using an anisotropic conductive film (ACF). Lead lines of the circuit board 21 may be electrically connected to the pads of the display panel 10. The circuit board 21 may be a flexible printed circuit board (FPCB) or a flexible film such as a chip-on-film (COF).

Referring to FIG. 2, the display panel 10 may include a display unit DU and a touch sensing unit TSU. The display unit DU may include a thin-film transistor layer TFTL disposed on a substrate SUB. The thin-film transistor layer TFTL may include a plurality of thin-film transistors (not shown) for driving an emission layer EML of a pixel PX.

The emission layer EML may be disposed on a surface of the thin-film transistor layer TFTL. The emission layer EML may include light-emitting elements that emit light. Each of the light-emitting elements may emit light with a predetermined luminance depending on an anode voltage and a cathode voltage applied from the thin-film transistor layer TFTL.

Each of the light-emitting elements may be an organic light-emitting diode including an anode electrode, a cathode electrode, and an organic emission layer disposed between the anode electrode and the cathode electrode. Alternatively, each of the light-emitting elements may be an inorganic light-emitting element including an anode electrode, a cathode electrode, and an inorganic semiconductor disposed between the anode electrode and the cathode electrode. Alternatively, each of the light-emitting elements may be a quantum-dot light-emitting element including an anode electrode, a cathode electrode, and a quantum-dot emission layer disposed between the anode electrode and the cathode electrode. Alternatively, each of the light-emitting elements may be a micro light-emitting diode.

An encapsulation layer TFEL may be disposed on the emission layer EML. The encapsulation layer TFEL may include a stack of inorganic films or organic films to prevent permeation of oxygen or moisture into the light-emitting elements of the emission layer EML.

The touch sensing unit TSU may include a touch layer TSL and may be disposed on the encapsulation layer TFEL. The touch sensing unit TSU may include a plurality of sensing electrodes SE (see FIG. 3) for sensing a user's touch.

Although the touch sensing unit TSU is formed directly on the encapsulation layer TFEL of the display panel 10 in FIG. 2, the embodiments of the disclosure are not limited thereto. The touch sensing unit TSU may be formed as a panel or film separated from the display panel 10 and may be attached on the display panel 10 by an adhesive member.

Although not shown in the drawings, the display device 1 may further include a protective layer disposed on the touch sensing unit TSU. For example, the protective layer may be a window member or an anti-reflection member for preventing deterioration of image visibility due to reflection of external light. The anti-reflection member may be a polarizing film or a color filter. The protective layer may be attached on the touch sensing unit TSU by an optically clear adhesive (OCA), etc.

Hereinafter, the above-described touch sensing unit TSU will be described in detail.

Figure 3:
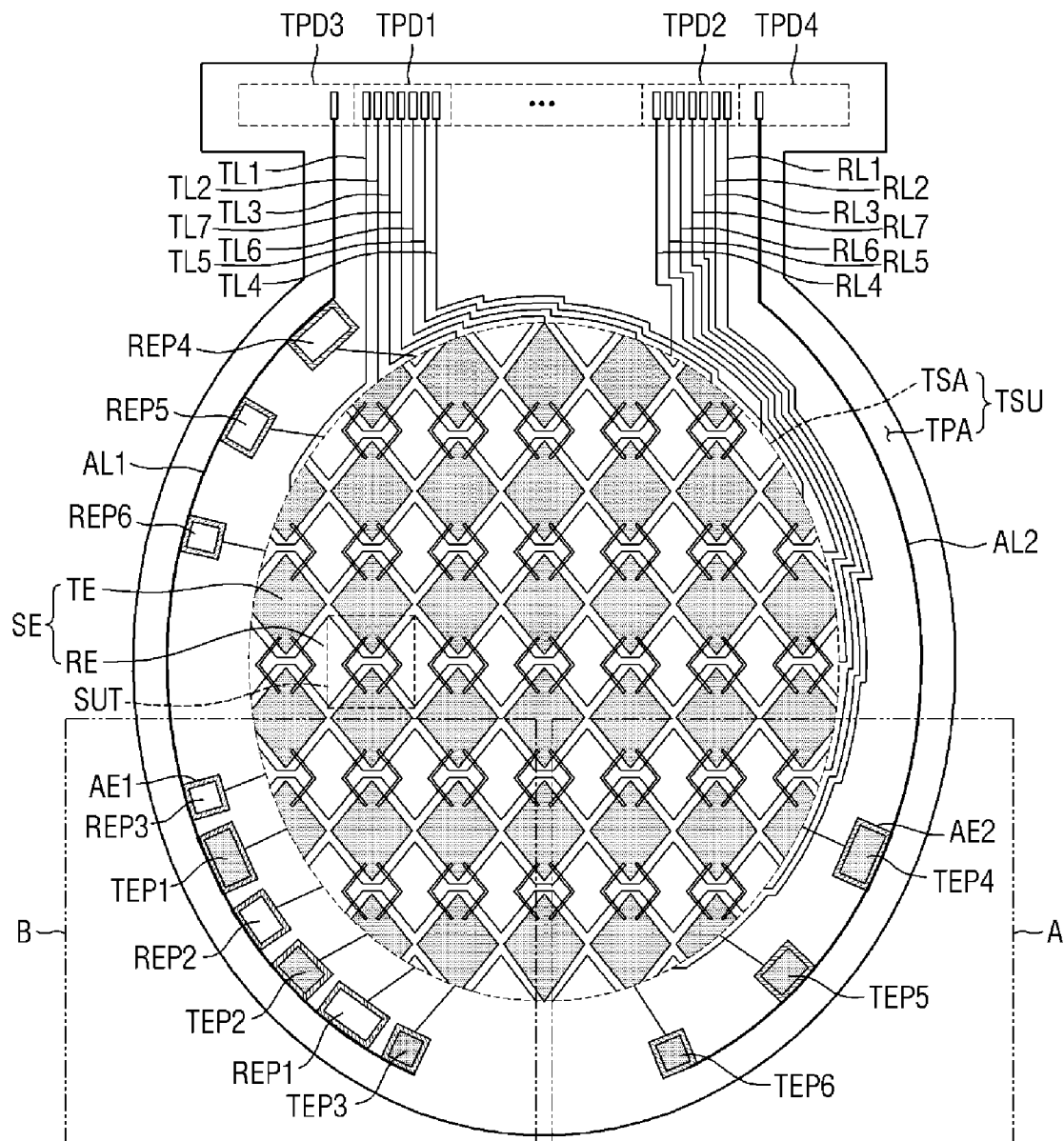
FIG. 3 is a plan view showing a layout of a touch sensing unit according to an embodiment of the disclosure.
Figure 4:
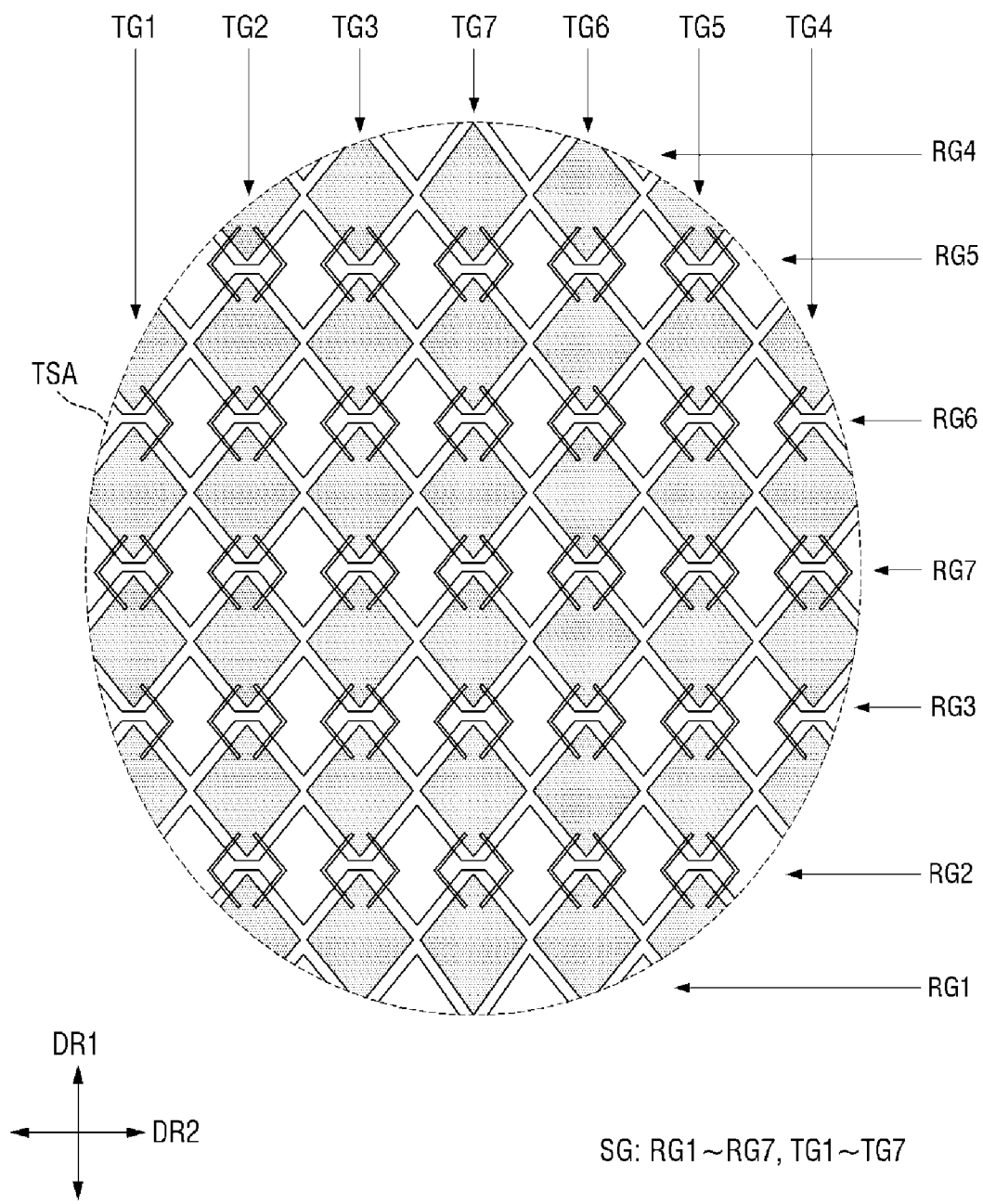
FIG. 4 is a plan view showing a layout of a touch sensing area of FIG. 3.

FIG. 3 is a plan view showing a layout of a touch sensing unit according to an embodiment of the disclosure. FIG. 4 is a plan view showing a layout of a touch sensing area of FIG. 3.

Referring to FIGS. 3 and 4, the touch sensing unit TSU includes a touch sensing area TSA for sensing a user's touch and a touch peripheral area TPA disposed around the touch sensor area TSA. The touch sensing area TSA may overlap the display area DA, and the touch peripheral area TPA may overlap the non-display area NDA (see in FIG. 1). Like the display area DA, the touch sensing area TSA may have a non-rectangular shape, and the touch sensing area TSA has a circular shape when viewed from the top in this embodiment as an example.

The touch sensing area TSA may include a plurality of sensor electrodes SE. The sensor electrodes SE may include two kinds of electrodes, i.e., the driving electrodes TE and the sensing electrodes RE. Touch driving signals are applied to the driving electrodes TE, and then the amount of change in charges in the mutual capacitance of a unit sensing area SUT may be sensed through the sensing electrodes RE. Alternatively, the plurality of sensor electrodes SE may recognize a touch by self-capacitance sensing using one kind of electrodes. In FIGS. 3 and 4, the touch sensing unit TSU by mutual capacitance sensing will be described, and the touch sensing unit TSU by self-capacitance sensing will be described later with reference to FIG. 16.

The touch sensing unit TSU may include a plurality of sensor groups SG, a plurality of sensor lines SL, and a plurality of touch pad areas TPD. The plurality of sensor groups SG may include a plurality of driving groups TG1, TG2, TG3, TG4, TG5, TG6, and TG7 and a plurality of sensing groups RG1, RG2, RG3, RG4, RG5, RG6, and RG7. In addition, the plurality of sensor lines SL may include a plurality of driving lines TL connected to the plurality of driving groups TG1, TG2, TG3, TG4, TG5, TG6, and TG7, and a plurality of sensing lines RL connected to the plurality of sensing groups RG1, RG2, RG3, RG4, RG5, RG6, and RG7.

The plurality of driving groups TG1, TG2, TG3, TG4, TG5, TG6, and TG7 may be arranged in the second direction DR2. The first, second, and third driving groups TG1, TG2, and TG3 among the plurality of driving groups TG1, TG2, TG3, TG4, TG5, TG6, and TG7 may be arranged from left side to the right side of the touch sensing area TSA along the second direction DR2. For example, the first driving group TG1 may be disposed at the leftmost position of the touch sensing area TSA, the second driving group TG2 may be disposed on the right side of the first driving group TG1, and the third driving group TG3 may be disposed on the right side of the second driving group TG2.

The fourth, fifth, and sixth driving groups TG4, TG5, and TG6 among the plurality of driving groups TG1, TG2, TG3, TG4, TG5, TG6, and TG7 may be arranged from right side to the left side of the touch sensing area TSA along the second direction DR2. For example, the fourth driving group TG4 may be disposed at the rightmost position of the touch sensing area TSA, the fifth driving group TG5 may be disposed on the left side of the fourth driving group TG4, and the sixth driving group TG6 may be disposed on the left side of the fifth driving group TG5.

The seventh driving group TG7 among the plurality of driving groups TG1, TG2, TG3, TG4, TG5, TG6, and TG7 may be disposed between the third driving group TG3 and the sixth driving group TG6. It should be noted that the position of the seventh driving group TG7 is not limited thereto.

The plurality of driving groups TG1, TG2, TG3, TG4, TG5, TG6, and TG7 may be electrically isolated from one another. The plurality of driving groups TG1, TG2, TG3, TG4, TG5, TG6, and TG7 may be extended in the first direction DR1. Each of the plurality of driving groups TG1, TG2, TG3, TG4, TG5, TG6, and TG7 includes a plurality of driving electrodes TE electrically connected with one another in the first direction DR1. The driving electrodes TE adjacent to one another in the first direction DR1 may be connected with one another through first connecting portions CP1 (see FIG. 5).

The plurality of sensing groups RG1, RG2, RG3, RG4, RG5, RG6, and RG7 may be arranged in the first direction DR1.

The first, second, and third sensing groups RG1, RG2, and RG3 among the plurality of sensing groups RG1, RG2, RG3, RG4, RG5, RG6, and RG7 may be arranged from the lower side to the upper side of the touch sensing area TSA along the first direction DAL For example, the first sensing group RG1 may be disposed at the lowermost position of the touch sensing area TSA, the second sensing group RG2 may be disposed on the upper side of the first sensing group RG1, and the third sensing group RG3 may be disposed on the upper side of the second sensing group RG2.

The fourth, fifth, and sixth sensing groups RG4, RG5, and RG6 among the plurality of sensing groups RG1, RG2, RG3, RG4, RG5, RG6, and RG7 may be arranged from the upper side to the lower side of the touch sensing area TSA. For example, the fourth sensing group RG4 may be disposed at the uppermost position of the touch sensing area TSA, the fifth sensing group RG5 may be disposed on the lower side of the fourth sensing group RG4, and the sixth sensing group RG6 may be disposed on the lower side of the fifth sensing group RG5.

The seventh sensing group RG7 among the plurality of sensing groups RG1, RG2, RG3, RG4, RG5, RG6, and RG7 may be disposed between the third sensing group RG3 and the sixth sensing group RG6. It should be noted that the position of the seventh sensing group RG7 is not limited thereto.

The plurality of sensing groups RG1, RG2, RG3, RG4, RG5, RG6, and RG7 may be electrically isolated from one another. The plurality of sensing groups RG1, RG2, RG3, RG4, RG5, RG6, and RG7 may be extended in the second direction DR2. Each of the plurality of sensing groups RG1, RG2, RG3, RG4, RG5, RG6, and RG7 includes a plurality of sensing electrodes RE electrically connected with one another in the second direction DR2. The sensing electrodes RE adjacent to one another in the second direction DR2 may be connected with one another through second connecting portions CP2 (see FIG. 5).

Since the plurality of driving groups TG1, TG2, TG3, TG4, TG5, TG6, and TG7 are electrically separated from the plurality of sensing groups RG1, RG2, RG3, RG4, RG5, RG6, and RG7, the unit sensing area SUT may be formed at each of the intersections of the plurality of driving groups TG1, TG2, TG3, TG4, TG5, TG6, and TG7 and the plurality of sensing groups RG1, RG2, RG3, RG4, RG5, RG6, and RG7. Mutual capacitance between the driving groups TG1, TG2, TG3, TG4, TG5, TG6, and TG7 and the sensing groups RG1, RG2, RG3, RG4, RG5, RG6, and RG7 may be formed in each of the unit sensing areas SUT. In this instance, by applying touch driving signals to the plurality of driving groups TG1, TG2, TG3, TG4, TG5, TG6, and TG7, the mutual capacitance of each of the unit sensing areas SUT can be charged. In addition, the amount of change in the mutual capacitance of each of the unit sensing areas SUT may be sensed through the plurality of sensing groups RG1, RG2, RG3, RG4, RG5, RG6, and RG7.

Although the plurality of driving electrodes TE and the plurality of sensing electrodes RE have a diamond shape when viewed from the top in FIGS. 3 and 4, the disclosure is not limited thereto. For example, the plurality of driving electrodes TE and the plurality of sensing electrodes RE may have other quadrangular shape than a diamond, other polygonal shapes than a quadrangular shape, a circle or an ellipse when viewed from the top.

Each of the plurality of driving groups TG1, TG2, TG3, TG4, TG5, TG6, and TG7 may form a line shape, in which a different number of driving electrodes TE are connected with one another depending on the shape of the touch sensing unit TSU when viewed from the top. Accordingly, the plurality of driving groups TG1, TG2, TG3, TG4, TG5, TG6, and TG7 may have different areas.

Figure 7:
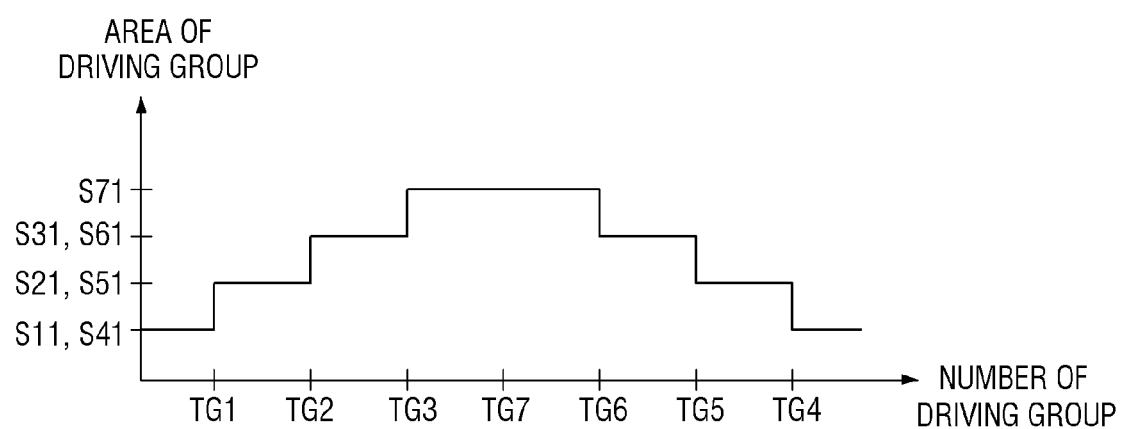
FIG. 7 is a graph for comparing the areas depending on the numbers of driving groups in a touch sensing unit according to an embodiment.

For example, the area of the plurality of driving electrodes TE included in the first driving group TG1 may be defined as the area of the first driving group TG1 (S11 in FIG. 7). The area of the plurality of driving electrodes TE included in the second driving group TG2 may be defined as the area of the second driving group TG2 (S21 in FIG. 7), the area of the plurality of driving electrodes TE included in the third driving group TG3 may be defined as the area of the third driving group TG3 (S31 in FIG. 7), the area of the plurality of driving electrodes TE included in the fourth driving group TG4 may be defined as the area of the fourth driving group TG4 (S41 in FIG. 7), the area of the plurality of driving electrodes TE included in the fifth driving group TG5 may be defined as the area of the fifth driving group TG5 (S51 in FIG. 7), the area of the plurality of driving electrodes TE included in the sixth driving group TG6 may be defined as the area of the sixth driving group TG6 (S61 in FIG. 7), and the area of the plurality of driving electrodes TE included in the seventh driving group TG7 may be defined as the area of the seventh driving group TG7 (S71 in FIG. 7).

Since the length of the seventh driving group TG7 in the first direction DR1 has the maximum value when viewed from the top, the area S71 of the seventh driving group TG7 may be larger than the areas S11, S21, S31, S41, S51, and S61 of the first to sixth driving groups TG1, TG2, TG3, TG4, TG5, and TG6.

According to an embodiment of the disclosure where the touch sensing area TSA has a symmetry structure when viewed from the top, the area S11 of the first driving group TG1 may be equal to the area S41 of the fourth driving group TG4, the area S21 of the second driving group TG2 may be equal to the area S51 of the fifth driving group TG5, and the area S31 of the third driving group TG3 may be equal to the area S61 of the sixth driving group TG6. It should be understood, however, that the touch sensing area TSA may have various shapes and thus the relative areas are not limited thereto. Besides, the relationship between the areas S11, S21, S31, S41, S51, and S61 of the first to sixth driving groups TG1, TG2, TG3, TG4, TG5, and TG6 will be described in more detail with reference to FIG. 7.

Similarly, each of the plurality of sensing groups RG1, RG2, RG3, RG4, RG5, RG6, and RG7 may form a line shape, in which a different number of sensing electrodes RE are connected with one another depending on the shape of the touch sensing unit TSU when viewed from the top. Accordingly, the plurality of sensing groups RG1 to RG7 may have different areas.

According to an embodiment of the disclosure, the areas of the plurality of sensing groups RG1, RG2, RG3, RG4, RG5, RG6, and RG7 may be substantially equal to the areas S11, S21, S31, S41, S51, S61, and S71 of the plurality of driving groups TG1, TG2, TG3, TG4, TG5, TG6, and TG7, respectively. According to another embodiment, the areas of the plurality of sensing groups RG1, RG2, RG3, RG4, RG5, RG6, and RG7 may be different from the areas S11, S21, S31, S41, S51, S61, and S71 of the plurality of driving groups TG1, TG2, TG3, TG4, TG5, TG6, and TG7. Even in this case, the relative areas between the plurality of sensing groups RG1, RG2, RG3, RG4, RG5, RG6, and RG7 may be substantially identical to the relative areas between the areas S11, S21, S31, S41, S51, S61, and S71 of the plurality of driving groups TG1, TG2, TG3, TG4, TG5, TG6, and TG7.

The plurality of driving groups TG1, TG2, TG3, TG4, TG5, TG6, and TG7 may be connected to each of the driving lines TL which includes a first driving line (TL1, a second driving line TL2, a third driving line TL3, a fourth driving line TL4, a fifth driving line TL5, a sixth driving line TL6, and a seventh driving line TL7), on the upper side of the touch sensing area TSA. For example, the first driving group TG1 may be connected to the first driving line TL1, the second driving group TG2 may be connected to the second driving line TL2, the third driving group TG3 may be connected to the third driving line TL3, and the fourth driving group TG4 may be connected to the fourth driving line TL4. The fifth driving group TG5 may be connected to the fifth driving line TL5, the sixth driving group TG6 may be connected to the sixth driving line TL6, and the seventh driving group TG7 may be connected to the seventh driving line TL7.

The plurality of driving lines TL may be connected to a plurality of pads including a first touch pad area TPD1 among the plurality of touch pad areas TPD. The first touch pad area TPD1 may be connected to the driving circuit 22 through the circuit board 21.

Similarly, the plurality of sensing groups RG1, RG2, RG3, RG4, RG5, RG6, and RG7 may be connected to each of the sensing lines RL including a first sensing line RL1, a second sensing line RL2, a third sensing line RL3, a fourth sensing line RL4, a fifth sensing line RL5, a sixth sensing line RL6, and a seventh sensing line RL7, on the right side of the touch sensing area TSA. For example, the first sensing group RG1 may be connected to the first sensing line RL1, and the seventh sensing group RG7 may be connected to the seventh sensing line RL7.

The plurality of sensing lines RL may be connected to a plurality of pads including a second touch pad area TPD2 among the plurality of touch pad areas TPD. The second touch pad area TPD2 may be connected to the driving circuit 22 through the circuit board 21.

In order to achieve a uniform line resistance between the lines having different lengths, the overall length can be adjusted by extending the relatively short driving lines TL in a zigzag or winding shape. In this manner, it is possible to prevent RC delay of the driving signal and the sensing signal.

A plurality of peripheral electrodes SEP may be disposed in the touch peripheral area TPA. The plurality of peripheral electrodes SEP may include two kinds of electrodes, for example, driving peripheral electrodes TEP and sensing peripheral electrodes REP.

The driving peripheral electrodes TEP include first to sixth driving peripheral electrodes TEP1, TEP2, TEP3, TEP4, TEP5 and TEP6. Each of the first to sixth driving peripheral electrodes TEP1, TEP2, TEP3, TEP4, TEP5 and TEP6 may be electrically connected to each of the first to sixth driving groups TG1, TG2, TG3, TG4, TG5, and TG6, respectively, on the lower side of the touch sensing area TSA, except the seventh driving group TG7. For example, the first driving peripheral electrode TEP1 may be electrically connected to the first driving group TG1, the second driving peripheral electrode TEP2 may be electrically connected to the second driving group TG2, the third driving peripheral electrode TEP3 may be electrically connected to the third driving group TG3, the fourth driving peripheral electrode TEP4 may be electrically connected to the fourth driving group TG4, the fifth driving peripheral electrode TEP5 may be electrically connected to the fifth driving group TG5, and the sixth driving peripheral electrode TEP6 may be electrically connected to the sixth driving group TG6.

The plurality of driving peripheral electrodes TEP1, TEP2, TEP3, TEP4, TEP5 and TEP6 may be arranged in the second direction DR2. The first to third driving peripheral electrodes TEP1, TEP2, and TEP3 among the plurality of driving peripheral electrodes TEP1, TEP2, TEP3, TEP4, TEP5 and TEP6 may be arranged in a counterclockwise direction from the left side to the right side of the touch peripheral area TPA. That is, the first to third driving peripheral electrodes TEP1, TEP2, and TEP3 may be disposed adjacent to the first to third driving groups TG1, TG2, and TG3, respectively.

The fourth to sixth driving peripheral electrodes TEP4, TEP5, and TEP6 among the plurality of driving peripheral electrodes TEP1, TEP2, TEP3, TEP4, TEP5 and TEP6 may be arranged in a clockwise direction from right side to left side of the touch peripheral area TPA. That is to say, the fourth to sixth driving peripheral electrodes TEP4, TEP5, and TEP6 may be disposed adjacent to the fourth to sixth driving groups TG4, TG5, and TG6, respectively.

The first to third driving peripheral electrodes TEP1, TEP2, and TEP3 may have different areas. Specifically, the area of the first driving peripheral electrode TEP1 (S12 in FIG. 8), the area of the second driving peripheral electrode TEP2 (S22 in FIG. 8), and the area of the third driving peripheral electrode TEP3 (S32 in FIG. 8) may be different from one another.

The fourth to sixth driving peripheral electrodes TEP4, TEP5, and TEP6 may have different areas. Specifically, the area of the fourth driving peripheral electrode TEP4 (S42 in FIG. 8), the area of the fifth driving peripheral electrode TEP5 (S52 in FIG. 8), and the area of the sixth driving peripheral electrode TEP6 (S62 in FIG. 8) may be different from one another.

As will be described later, the plurality of driving peripheral electrodes TEP1, TEP2, TEP3, TEP4, TEP5 and TEP6 may be electrically connected to the first to sixth driving groups TG1, TG2, TG3, TG4, TG5, and TG6 except the seventh driving group TG7, to compensate for a difference in capacitance. In this instance, the number of the plurality of driving peripheral electrodes TEP1, TEP2, TEP3, TEP4, TEP5 and TEP6 may be less than the number of the plurality of driving groups TG1, TG2, TG3, TG4, TG5, TG6, and TG7.

The sensing peripheral electrodes REP includes first to sixth sensing peripheral electrodes REP1, REP2, REP3, REP4, REP5 and REP6. Each of the first to sixth sensing peripheral electrodes REP1, REP2, REP3, REP4, REP5 and REP6 may be electrically connected to each of the first to sixth sensing groups RG1, RG2, RG3, RG4, RG5, and RG6, respectively, on the left side of the touch sensing area TSA, except the seventh sensing group RG7. For example, the first sensing peripheral electrode REP1 may be electrically connected to the first sensing group RG1, the second sensing peripheral electrode REP2 may be electrically connected to the second sensing group RG2, the third sensing peripheral electrode REP3 may be electrically connected to the third sensing group RG3, the fourth sensing peripheral electrode REP4 may be electrically connected to the fourth sensing group RG4, the fifth sensing peripheral electrode REP5 may be electrically connected to the fifth sensing group RG5, and the sixth sensing peripheral electrode REP6 may be electrically connected to the sixth sensing group RG6.

The plurality of sensing peripheral electrodes REP1, REP2, REP3, REP4, REP5 and REP6 may be arranged in the first direction DR1. The first to third sensing peripheral electrodes REP1, REP2, and REP3 among the plurality of sensing peripheral electrodes REP1, REP2, REP3, REP4, REP5 and REP6 may be arranged in the clockwise direction from the lower side to the upper side of the touch peripheral area TPA. That is, the first to third sensing peripheral electrodes REP1, REP2, and REP3 may be disposed adjacent to the first to third sensing groups RG1, RG2, and RG3, respectively.

The fourth to sixth sensing peripheral electrodes REP4, REP5, and REP6 among the plurality of sensing peripheral electrodes REP1, REP2, REP3, REP4, REP5 and REP6 may be arranged in the counterclockwise direction from the upper side to the lower side of the touch peripheral area TPA. That is, the fourth to sixth sensing peripheral electrodes REP4, REP5, and REP6 may be disposed adjacent to the fourth to sixth sensing groups RG4, RG5, and RG6, respectively.

According to an embodiment of the disclosure, the areas of the plurality of sensing peripheral electrodes REP1, REP2, REP3, REP4, REP5 and REP6 may be substantially equal to the areas S12, S22, S32, S42, S52, and S62 of the plurality of driving peripheral electrodes TEP1, TEP2, TEP3, TEP4, TEP5, and TEP6, respectively. According to another embodiment, the areas of the plurality of sensing peripheral groups REP1, REP2, REP3, REP4, REP5 and REP6 may be different from the areas S12, S22, S32, S42, S52, and S62 of the plurality of driving peripheral groups TEP1, TEP2, TEP3, TEP4, TEP5, and TEP6. Even in such case, the relative areas between the plurality of sensing peripheral electrodes REP1, REP2, REP3, REP4, REP5 and REP6 may be substantially identical to the relative areas between the areas S12, S22, S32, S42, S52, and S62 of the plurality of driving peripheral electrodes TEP1, TEP2, TEP3, TEP4, TEP5, and TEP6.

The plurality of sensing peripheral electrodes REP1, REP2, REP3, REP4, REP5 and REP6 may be electrically connected to the first to sixth sensing groups RG1, RG2, RG3, RG4, RG5, and RG6 except the seventh sensing group TG7, to compensate for a difference in capacitance. In this instance, the number of the plurality of sensing peripheral electrodes REP1, REP2, REP3, REP4, REP5 and REP6 may be less than the number of the plurality of sensing groups RG1, RG2, RG3, RG4, RG5, RG6, and RG7.

Auxiliary electrodes AE and auxiliary lines AL may be disposed in the touch peripheral area TPA. The auxiliary electrodes AE may overlap the plurality of driving peripheral electrodes TEP1, TEP2, TEP3, TEP4, TEP5, and TEP6 and the plurality of sensing peripheral electrodes REP1, REP2, REP3, REP4, REP5 and REP6. The auxiliary lines AL may be connected to the auxiliary electrodes AE.

The auxiliary electrodes AE may include a plurality of first auxiliary electrodes AE1 and a plurality of second auxiliary electrodes AE2. The plurality of first auxiliary electrodes AE1 may be arranged along the left edge, and the plurality of second auxiliary electrodes AE2 may be arranged along the right edge.

The plurality of first auxiliary electrodes AE1 may overlap with the first to third driving peripheral electrodes TEP1, TEP2, and TEP3 arranged from the upper side to the lower side along the right edge and the first to sixth sensing peripheral electrodes REP1, REP2, REP3, REP4, REP5 and REP6. For example, the plurality of first auxiliary electrodes AE1 may overlap in the fourth sensing peripheral electrode REP4, the fifth sensing peripheral electrode REP5, the sixth sensing peripheral electrode REP6, the third sensing peripheral electrode REP3, the first driving peripheral electrode TEP1, the second sensing peripheral electrode REP2, the second driving peripheral electrode TEP2, the first sensing peripheral electrode REP1, and the third driving peripheral electrode TEP3 in the thickness direction, respectively.

The plurality of second auxiliary electrodes AE2 may overlap the fourth to sixth driving peripheral electrodes TEP4, TEP5, and TEP6 arranged from the upper side to the lower side along the left edge. For example, the plurality of second auxiliary electrodes AE2 may overlap the fourth driving peripheral electrode TEP4, the fifth driving peripheral electrode TEP5, and the sixth driving peripheral electrode TEP6, respectively, in the thickness direction.

Figure 8:
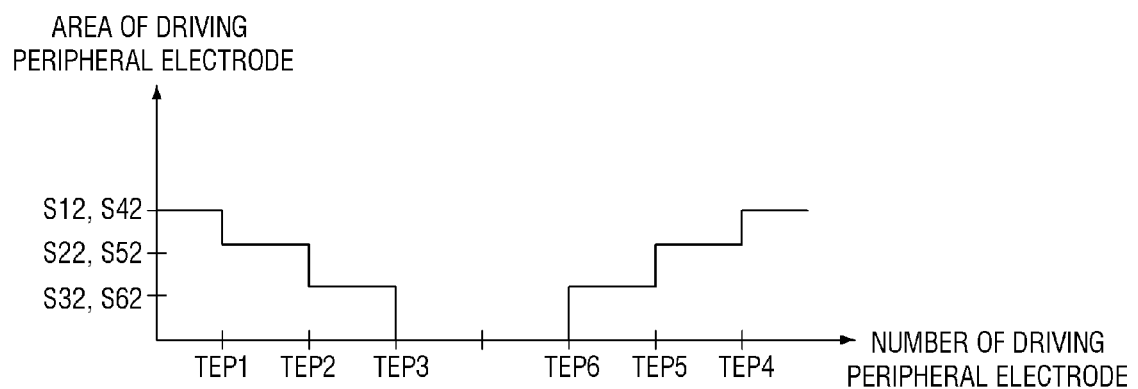
FIG. 8 is a graph for comparing the areas depending on the numbers of driving peripheral electrodes in a touch sensing unit according to an embodiment.

As the first and second auxiliary electrodes AE1 and AE2 overlap the plurality of peripheral electrodes SEP (TEP1, TEP2, TEP3, TEP4, TEP5, and TEP6 and REP1, REP2, REP3, REP4, REP5, and REP6) in the thickness direction in the touch peripheral area TPA, to form the compensation capacitor of FIG. 8.

The auxiliary lines AL may include a first auxiliary line AL1 and a second auxiliary line AL2. The first auxiliary line AL1 may be connected to the first auxiliary electrodes AE1 arranged along the left edge, and the second auxiliary line AL2 may be connected to the second auxiliary electrodes AE2 arranged along the right edge.

The first auxiliary line AL1 may be extended from the third touch pad area TPD3 to surround the left edge. The first auxiliary line AL1 may be disposed at the leftmost position. The second auxiliary line AL2 may be extended from the fourth touch pad area TPD4 to surround the right edge. The second auxiliary line AL2 may be disposed at the rightmost position.

The voltage applied to the first auxiliary line AL1 and the second auxiliary line AL2 may be equal to a second supply voltage ELVSS of the cathode electrode 180 (see FIG. 6) supplied to the display unit DU. It should be understood, however, that the disclosure is not limited thereto. For another example, the voltage applied to the first auxiliary line AL1 and the second auxiliary line AL2 may be equal to a first supply voltage ELVDD of the anode electrode 170 (see FIG. 6) supplied to the display unit DU. As yet another example, the voltage of the first auxiliary line AL1 and the second auxiliary line AL2 may have a constant potential. As yet another example, the voltage of the first auxiliary line AL1 and the second auxiliary line AL2 may be ground voltage.

Hereinafter, an example of the planar arrangement and the cross-sectional structure of pixels PX and a touch sensing unit TSU will be described.

Figure 5:
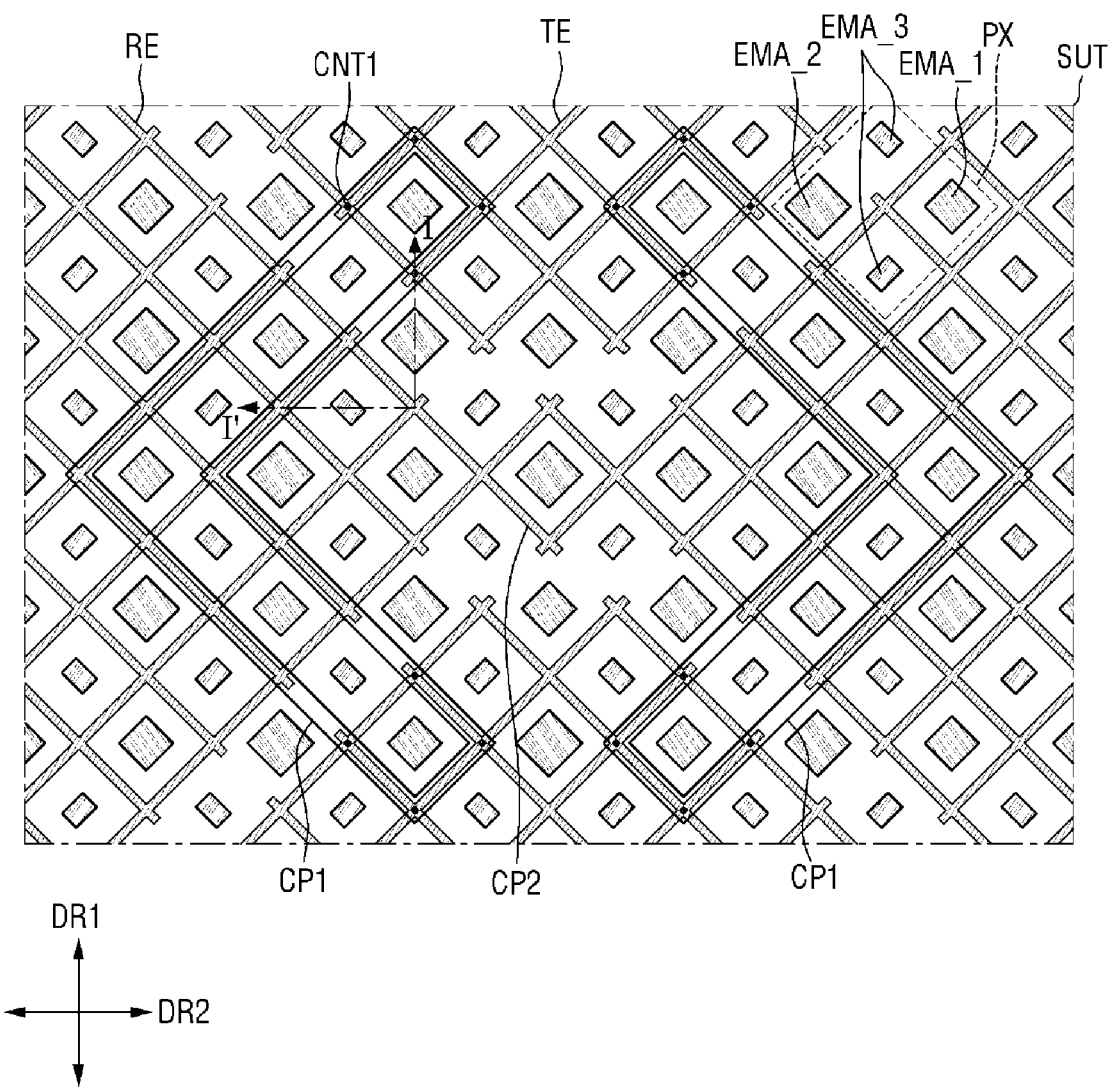
FIG. 5 is an enlarged view showing pixels and sensor electrodes of the touch sensing unit of the display unit of FIG. 3.
Figure 6:
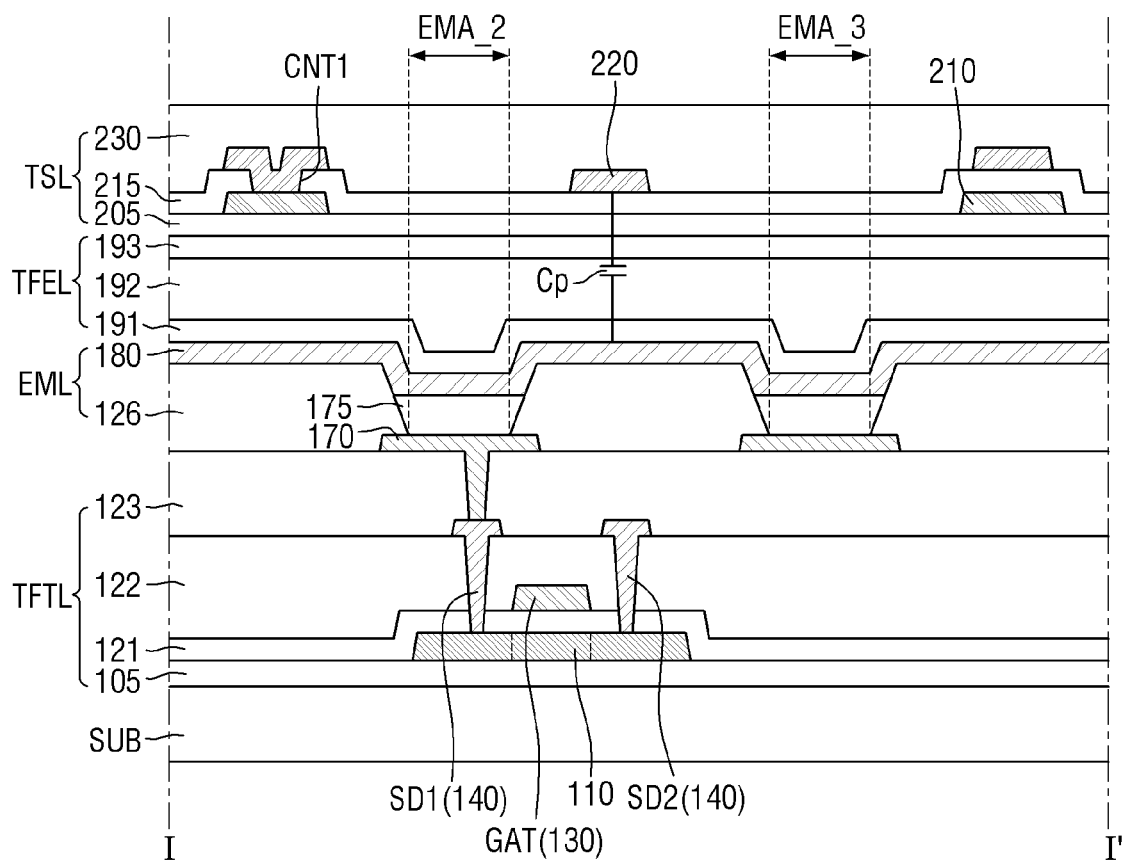
FIG. 6 is a cross-sectional view taken along line I-I' of FIG. 5.

FIG. 5 is an enlarged view showing pixels and sensor electrodes of the touch sensing unit of the display unit of FIG. 3. FIG. 6 is a cross-sectional view taken along line I-I' of FIG. 5. FIG. 5 shows an example of a unit sensing area of FIG. 3.

Referring to FIG. 5, the display unit DU includes a plurality of pixels PX. Each of the pixels PX includes emission areas EMA having a first emission area EMA_1, a second emission area EMA_2, and a third emission area EMA_3. Each of the pixels PX may include a first color pixel, a second color pixel, and a third color pixel. The emission areas EMA of the color pixels PX may be arranged in various ways. According to an embodiment of the disclosure, the first emission area EMA_1 of the first color pixel and the second emission area EMA_2 of the second color pixel may be alternately arranged in the second direction DR2 to form a first row, while the third emission area EMA_3 of the third color pixel may be arranged in the second direction DR2 to form a second row next to the first row. The pixels PX belonging to the second row may be arranged in a staggered manner in the second direction DR2 with respect to the pixels PX belonging to the first row. The arrangement of the first and second rows may be repeated along the second direction DR2.

The emission areas EMA in the color pixels PX may have different sizes, and may each have, but is not limited to, a diamond shape or a rectangular shape when viewed from the top.

The driving electrodes TE and the sensing electrodes RE may be insulated from each other and intersect each other. The driving electrodes and the sensing electrodes RE can be insulated from each other as they are connected with each other via a conductive layer located on a different level at the intersections. The driving electrodes TE and the sensing electrodes RE may intersect each other by the first connecting portions CP1 and/or the second connecting portions CP2. For example, the first connecting portions CP1 may connect between the adjacent driving electrodes TE through touch contact holes CNT1. In order to insulate the driving electrodes TE and the sensing electrodes RE from each other at their intersections, at least one of the first connecting portions CP1 and the second connecting portions CP2 may be located on a different layer from the driving electrodes TE and the sensing electrodes RE.

Each of the driving electrodes TE, the sensing electrodes RE, and the first and second connecting portions CP1 and CP2 may have a mesh pattern. Accordingly, the driving electrodes TE, the sensing electrodes RE, and the first and second connecting portions CP1 and CP2 may not overlap the emission areas EMA of the pixels PX.

Referring to FIG. 6, the display layer 1 may include a substrate SUB, a thin-film transistor layer TFTL, an emission layer EML, an encapsulation layer TFEL, and a touch layer TSL.

The substrate SUB may support a variety of layers disposed thereon. The substrate may include the touch sensing area TSA and the touch peripheral area TPA. The substrate SUB may be made of an insulating material such as a polymer resin, or an inorganic material such as glass and quartz. It is, however, to be understood that the disclosure is not limited thereto. The substrate SUB may be a flexible substrate that can be bent, rolled or folded.

The buffer layer 105 is disposed on the substrate SUB. The buffer layer 105 may include silicon nitride, silicon oxide, silicon oxynitride, or the like.

The semiconductor layer 110 is disposed on the buffer layer 105. The semiconductor layer 110 forms a channel of a thin-film transistor of a pixel PX.

The first insulating layer 121 is disposed on the semiconductor layer 110. The first insulating layer 121 may be a gate insulating layer having a gate insulating function.

A first conductive layer 130 is disposed on the first insulating layer 121. The first conductive layer 130 may include a gate electrode GAT of the thin-film transistor of the pixel PX.

A second insulating layer 122 may be disposed on the first conductive layer 130. The second insulating layer 122 may be an interlayer dielectric film.

A second conductive layer 140 is disposed on the second insulating layer 122.

The second conductive layer 140 may include a first electrode SD1 and a second electrode SD2 of the thin-film transistor of the pixel PX. The first electrode SD1 and the second electrode SD2 of the thin-film transistor may be connected to the source region and the drain region of the semiconductor layer 110, respectively, through contact holes passing through the second insulating layer 122 and the first insulating layer 121.

A third insulating layer 123 is disposed on the second conductive layer 140. The third insulating layer 123 covers the second conductive layer 140. The third insulating layer 123 may be a via layer. The third insulating layer 123 may include an organic insulating film. In such case, the upper surface of the third insulating layer 123 may be substantially flat despite level differences thereunder.

An anode electrode 170 is disposed on the third insulating layer 123. The anode electrode 170 may be a pixel electrode disposed in each of the pixels PX. The anode electrode 170 may be connected to a source electrode or a drain electrode of the thin-film transistor through a contact hole penetrating through the third insulating layer 123. The anode electrode 170 may at least partially overlap the emission area EMA.

A pixel-defining film 126 may be disposed on the anode electrode 170. The pixel-defining film 126 may be disposed over the anode electrode 170 and may include an opening exposing the anode electrode 170. The emission areas EMA may be distinguished from one another by the pixel-defining film 126 and the openings thereof.

An organic layer 175 is disposed on the anode electrode 170 exposed by the pixel-defining film 126. The organic layer 175 may include an organic material to emit light having a certain wavelength. The organic layer 175 may further include a hole injecting/transporting layer and/or an electron injecting/transporting layer.

A cathode electrode 180 may be disposed on the organic layer 175. The cathode electrode 180 may be a common electrode disposed across the pixels PX. The anode electrode 170, the organic layer 175 and the cathode electrode 180 may form an organic light-emitting element.

When the anode electrode 170 receives the first supply voltage ELVDD through the thin-film transistor of the thin-film transistor layer TFTL and the cathode electrode 180 receives the second supply voltage ELVSS, holes and electrons may move to the organic layer 175 and combine with each other. The organic light-emitting element may emit light in response to a driving current corresponding to the data signal applied to the thin-film transistor.

The encapsulation layer TFEL including a first inorganic encapsulation film 191, an organic encapsulation film 192, and a second inorganic encapsulation film 193 is disposed on the cathode electrode 180. The first inorganic encapsulation film 191 and the second inorganic encapsulation film 193 may be in contact with each other at the end of the encapsulation layer TFEL. The organic encapsulation film 192 can be encapsulated by the first inorganic encapsulation film 191 and the second inorganic encapsulation film 193.

The touch layer TSL may be disposed on the encapsulation layer TFEL. The touch layer TSL may include a base layer 205, a first touch conductive layer 210 disposed on the base layer 205, a first touch insulating layer 215 disposed on the first touch conductive layer 210, a second touch conductive layer 220 disposed on the first touch insulating layer 215, and a second touch insulating layer 230 covering the second touch conductive layer 220.

Specifically, the first touch conductive layer 210 is disposed on the base layer 205. The first touch conductive layer 210 is covered by the first touch insulating layer 215. The first touch insulating layer 215 insulates the first touch conductive layer 210 from the second touch conductive layer 220. The second touch conductive layer 220 is disposed on the first touch insulating layer 215. The second touch insulating layer 230 covers and protects the second touch conductive layer 220.

The base layer 205 may include an inorganic insulating material. In some embodiments, the base layer 205 may be replaced with the second inorganic encapsulation film 193 forming the thin-film encapsulation layer TFEL to be described later. In this instance, the first touch conductive layer 210 may be disposed directly on the second inorganic encapsulation film 193.

According to an embodiment of the disclosure, the first connecting portions CP1 may be formed as the first touch conductive layer 210, while the driving electrodes TE, the sensing electrodes RE and the second connecting portions CP2 may be formed as the second touch conductive layer 220 located above the first touch conductive layer 210 with the first touch insulating layer 215 therebetween. Thanks to such a structure, the driving electrodes TE and the sensing electrodes RE can be insulated from each other at the intersections. It should be understood, however, that the disclosure is not limited thereto. The second connecting portions CP2 may be formed as the first touch conductive layer 210, while the driving electrodes TE, the first connecting portions CP1 and the sensing electrodes RE may be formed as the second touch conductive layer 220.

Each of the driving electrodes TE and the sensing electrodes RE may be formed in a planar pattern or a mesh pattern.

When the driving electrodes TE and the sensing electrodes RE are formed in a mesh pattern, the first touch conductive layer 210 and the second touch conductive layer 220 may be made of a low-resistance material such as aluminum.

When the driving electrodes TE and the sensing electrodes RE are formed in a planar pattern, even though first touch conductive layer 210 is made of a low-resistance material such as aluminum, the second touch conductive layer 220 may be formed as a transparent conductive layer forming the driving electrodes TE and the sensing electrode RE. Each of the transparent conductive layers may include a transparent conductive oxide such as indium tin oxide (ITO), indium zinc oxide (IZO), zinc oxide (ZnO) and indium tin zinc oxide (ITZO), a conductive polymer such as PEDOT, metal nanowire, grahpene, etc.

Hereinafter, an example will be described where the driving electrodes TE and the sensing electrodes RE are formed in a mesh pattern.

The first touch insulating layer 215 and the second touch insulating layer 230 may include an inorganic insulating material or an organic insulating material. In an embodiment, the first touch insulating layer 215 or the second touch insulating layer 230 may include an inorganic material and the other may include an organic material.

A touch contact hole CNT1 is defined in the first touch insulating layer 215. The first touch conductive layer 210 (e.g., the first connecting portion CP1) may be electrically connected to a part of the second touch conductive layer 220 (e.g., the driving electrode TE) through the touch contact hole CNT1.

The second touch conductive layer 220 overlaps the pixel-defining film 126 and has the mesh pattern that does not overlap the emission area EMA, and thus it neither interferes with the emission of light nor is seen by a viewer.

A parasitic capacitor may be formed between the above-described cathode electrode 180 and the second touch conductive layer 220. That is, the parasitic capacitor includes the cathode electrode 180 and the second touch conductive layer 220 facing it as the opposing electrode. The insulating material such as the encapsulation layer TFEL, a base layer and the first touch insulating layer 215 interposed between the electrodes facing each other may work as a dielectric layer of the parasitic capacitor.

The parasitic capacitance value Cp of such a parasitic capacitor varies depending on the area where each of the sensor groups SG1, SG2, SG3, SG4, SG5, SG6, and SG7 including the plurality of sensor electrodes SE disposed on the touch sensing unit TSU overlaps the cathode electrode 180. For example, when the touch sensing unit TSU has a polygonal shape such as a circle when viewed from the top, the area S71 of the seventh driving group TG7 has the largest value while the areas S11, S21, S31, S41, S51, and S61 of the other first to sixth driving groups TG1, TG2, TG3, TG4, TG5, and TG6 have relatively small values, and thus the parasitic capacitance value Cp of the parasitic capacitor formed with the cathode electrode 180 may vary.

As such, when the driving groups TG1, TG2, TG3, TG4, TG5, TG6, and TG7 and the sensing groups RG1, RG2, RG3, RG4, RG5, RG6, and RG7 have different parasitic capacitance values Cp, there may be a difference in a touch sensing signal or the touch may not be sensed correctly. Such a difference can be compensated for by the first to sixth driving peripheral electrodes TEP1, TEP2, TEP3, TEP4, TEP5, and TEP6 connected to the first to sixth driving groups TG1, TG2, TG3, TG4, TG5, and TG6, respectively, except the seventh driving group TG7, and the first to sixth sensing peripheral electrodes REP1, REP2, REP3, REP4, REP5, and REP6 connected to the first to sixth sensing groups RG1, RG2, RG3, RG4, RG5, and RG6, respectively, except the seventh sensing group RG7. A principle of compensating for a capacitance value will be described with reference to FIGS. 7, 8, 9, and 10.

Figure 9:
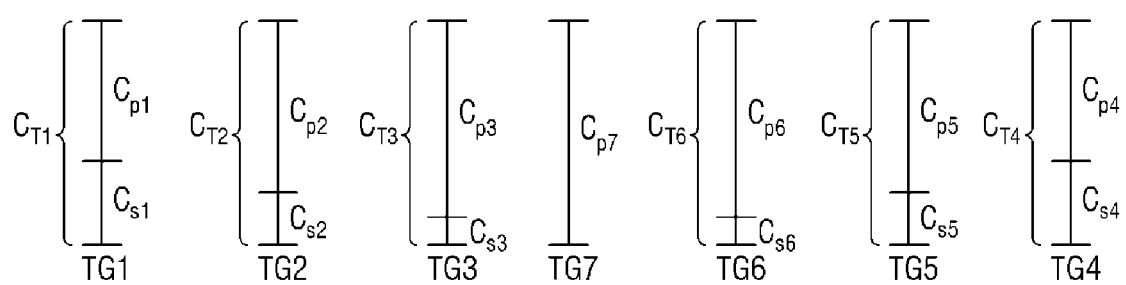
FIG. 9 is schematically showing compensated capacitance values in a touch sensing unit according to an embodiment of the disclosure.
Figure 10:
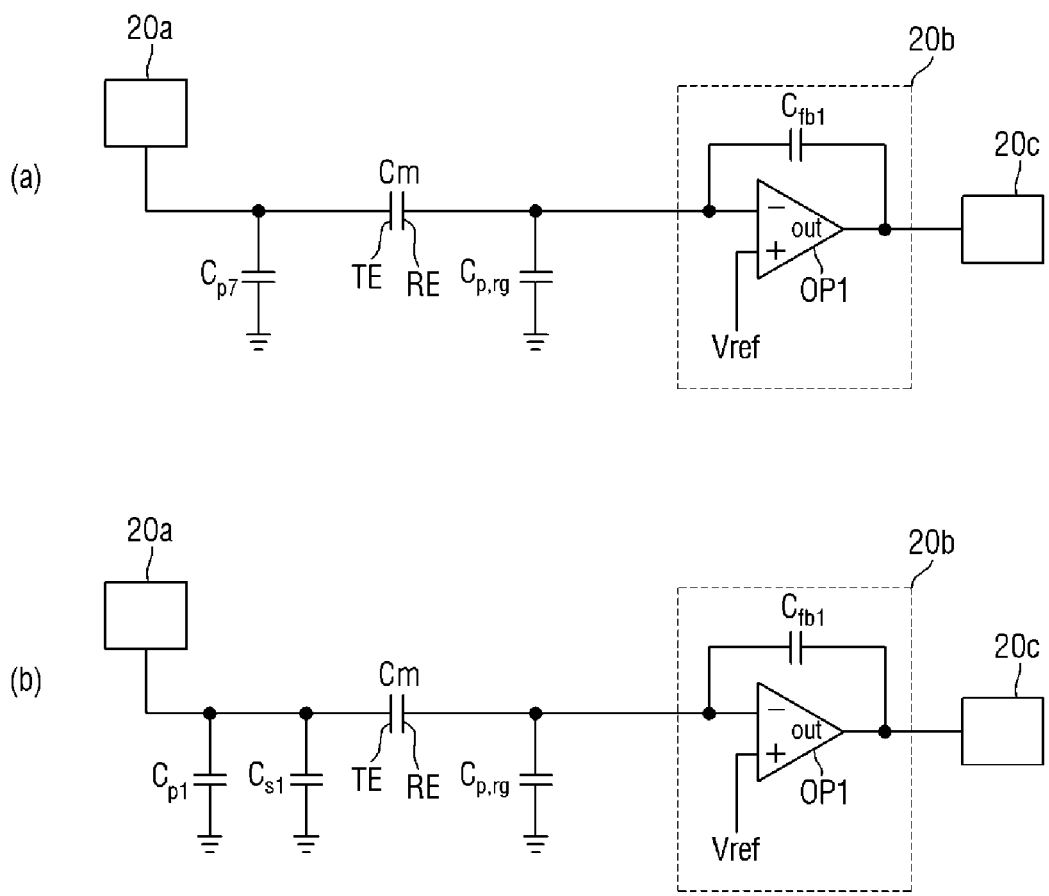
FIG. 10 is a circuit diagram showing a touch detection scheme that reflects capacitance compensation of sensor groups in a touch sensing unit according to an embodiment.

FIG. 7 is a graph for comparing the areas depending on the numbers of driving groups in a touch sensing unit according to an embodiment. FIG. 8 is a graph for comparing the areas depending on the numbers of driving peripheral electrodes in a touch sensing unit according to an embodiment. FIG. 9 is a view schematically showing compensated capacitance values in a touch sensing unit according to an embodiment of the disclosure. FIG. 10 is a circuit diagram showing a touch detection scheme that reflects capacitance compensation of sensor groups in a touch sensing unit according to an embodiment. The relationship between the driving groups and the driving peripheral electrodes will be described with reference to FIGS. 7, 8, 9, and 10, which can be equally applied to the sensing groups and the sensing peripheral electrodes.

The area S71 of the seventh driving group TG7 may be larger than the other areas S11, S21, S31, S41, S51 and S61 of the first to sixth driving groups TG1, TG2, TG3, TG4, TG5, and TG6. The areas S11, S21, and S31 of the first to third driving groups TG1. TG2, and TG3 arranged from right to left with respect to the seventh driving group TG7 may be sequentially decreased. The areas S41, S51, and S61 of the fourth to sixth driving groups TG4, TG5, and TG6 arranged from left to right with respect to the seventh driving group TG7 may be sequentially decreased.

For example, the area S11 of the first driving group TG1 may be smaller than the areas S21 and S31 of the second and third driving groups TG2 and TG3. The area S21 of the second driving group TG2 may be larger than the area S11 of the first driving group TG1 but may be smaller than the area S31 of the third driving group TG3. The area S31 of the third driving group TG3 may be larger than the areas S11 and S21 of the first and second driving groups TG1 and TG2. The addition of the areas S11 and S21 may be larger than the area of S31 or equal to the area of S31.

In addition, the area S41 of the fourth driving group TG4 may be smaller than the areas S51 and S61 of the fifth and sixth driving groups TG5 and TG6. The area S51 of the fifth driving group TG5 may be larger than the area S41 of the fourth driving group TG4 but may be smaller than the area S61 of the sixth driving group TG6. The area S61 of the sixth driving group TG6 may be larger than the areas S41 and S51 of the fourth and fifth driving groups TG4 and TG5. The addition of the areas S41 and S51 may be larger than the area of S61 or equal to the area of S61.

According to this embodiment, the area S11 of the first driving group TG1 may be substantially equal to the area S41 of the fourth driving group TG4, the area S21 of the second driving group TG2 may be substantially equal to the area S51 of the fifth driving group TG5, and the area S31 of the third driving group TG3 may be substantially equal to the area S61 of the sixth driving group TG6. It should be understood, however, that they may have different values. It should be noted that even when they have different values, the relative areas between the first to third driving groups TG1, TG2, and TG3 and the seventh driving group TG7 may be the same as the relative areas between the fourth to sixth driving groups TG4, TG5, and TG6 and the seventh driving group TG7.

The first to sixth driving groups TG1, TG2, TG3, TG4, TG5, and TG6 except the seventh driving group TG7 having the largest area may be electrically connected to the first to sixth driving peripheral electrodes TEP1, TEP2, TEP3, TEP4, TEP5, and TEP6. The first to sixth driving peripheral electrodes TEP1, TEP2, TEP3, TEP4, TEP5, and TEP6 may be electrically connected to the first to sixth driving groups TG1, TG2, TG3, TG4, TG5, and TG6 to compensate for differences in the areas so that they have areas similar to the area S71 of the seventh driving group TG7.

For example, the area S12 of the first driving peripheral electrode TEP1 may be larger than the areas S22 and S32 of the second and third driving peripheral electrodes TEP2 and TEP3. The area S22 of the second driving peripheral electrode TEP2 may be smaller than the area S12 of the first driving peripheral electrode TEP1 but may be larger than the area S32 of the third driving peripheral electrode TEP3. The area S32 of the third driving peripheral electrode TEP3 may be smaller than the areas S12 and S22 of the first and second driving peripheral electrode TEP1 and TEP2.

In addition, the area S42 of the fourth driving peripheral electrode TEP4 may be larger than the areas S52 and S62 of the fifth and sixth driving peripheral electrodes TEP5 and TEP6. The area S52 of the fifth driving peripheral electrode TEP5 may be smaller than the area S42 of the fourth driving peripheral electrode TEP4 but may be larger than the area S62 of the sixth driving peripheral electrode TEP6. The area S62 of the sixth driving peripheral electrode TEP6 may be smaller than the areas S42 and S52 of the fourth and fifth driving peripheral electrode TEP4 and TEP5.

As described above, since each of the plurality of driving groups TG1, TG2, TG3, TG4, TG5, TG6, and TG7 overlaps the cathode electrode 180 in the thickness direction to form a parasitic capacitor, the main areas S11, S21, S31, S41, S51, S61, and S71 of the driving groups TG1, TG2, TG3, TG4, TG5, TG6, and TG7 are proportional to the parasitic capacitance value Cp formed. This may be defined as Expression 1 below:

$$S_{n1} \propto Cpn \ (n \leq 7, \text{natural number}) \quad \text{[Expression 1]}$$

where $S_{n1}$ denotes the area of each driving group, and Cpn denotes a parasitic capacitance value formed where each driving group and the cathode electrode 180 overlap each other.

Referring to FIG. 9 and Expression 1, the seventh parasitic capacitance value Cp7 of the seventh driving group TG7 has the largest value, and the third parasitic capacitance value Cp3 of the third driving group TG3, the second parasitic capacitance value Cp2 of the second driving group TG2 and the first parasitic capacitance value Cp1 of the first driving group TG1 may decrease sequentially. In addition, the sixth parasitic capacitance value Cp6 of the sixth driving group TG6, the fifth parasitic capacitance value Cp5 of the fifth driving group TG5 and the fourth parasitic capacitance value Cp4 of the fourth driving group TG4 may decrease sequentially.

The different parasitic capacitance values Cp can be compensated for by compensation capacitors formed where the driving peripheral electrodes TEP1 to TEP6 overlap with the auxiliary electrodes AE1 and AE2. In such case, the compensation capacitance value Cs of the compensation capacitors may be equal to a difference between the seventh parasitic capacitance value Cp7 having the largest value and the first to sixth parasitic capacitance values Cp1, Cp2, Cp3, Cp4, Cp5, and Cp6.

For example, the first compensation capacitance value Cs1 may be equal to the difference between the fourth parasitic capacitance value Cp4 and the first parasitic capacitance value Cp1. The second compensation capacitance value Cs2 may be equal to the difference between the seventh parasitic capacitance value Cp7 and the second parasitic capacitance value Cp2. The third compensation capacitance value Cs3 may be equal to the difference between the seventh parasitic capacitance value Cp7 and the third parasitic capacitance value Cp3. In addition, the fourth compensation capacitance value Cs4 may be equal to the difference between the seventh parasitic capacitance value Cp7 and the fourth parasitic capacitance value Cp4. The fifth compensation capacitance value Cs5 may be equal to the difference between the seventh parasitic capacitance value Cp7 and the fifth parasitic capacitance value Cp5. The sixth compensation capacitance value Cs6 may be equal to the difference between the seventh parasitic capacitance value Cp7 and the sixth parasitic capacitance value Cp6.

Accordingly, the sum of the first parasitic capacitance value Cp1 and the first compensation capacitance value Cs1 (i.e., the first capacitance value CT1) may be substantially equal to the seventh parasitic capacitance value Cp7. In addition, the sum of the second parasitic capacitance value Cp2 and the second compensation capacitance value Cs2

(i.e., the second capacitance value CT2) may be substantially equal to the seventh parasitic capacitance value Cp7. In addition, the sum of the third parasitic capacitance value Cp3 and the third compensation capacitance value Cs3 (i.e., the third capacitance value CT3) may be substantially equal to the seventh parasitic capacitance value Cp7. The sum of the fourth parasitic capacitance value Cp4 and the fourth compensation capacitance value Cs4 (i.e., the fourth capacitance value CT4) may be substantially equal to the seventh parasitic capacitance value Cp7, the sum of the fifth parasitic capacitance value Cp5 and the fifth compensation capacitance value Cs5 (i.e., the fifth capacitance value CT5) may be substantially equal to the seventh parasitic capacitance value Cp7, and the sum of the sixth parasitic capacitance value Cp6 and the sixth compensation capacitance value Cs6 (i.e., the sixth capacitance value CT6) may be substantially equal to the seventh parasitic capacitance value Cp7.

This can be expressed by Expression 2 below:

$$Csn \leq Cp7 - Cpn$$

$$Ctn = Cpn + Csn \leq Cp7 \quad (n<7, \text{natural number}) \quad \text{[Expression 2]}$$

where Csn denotes the compensation capacitance of each of the driving peripheral electrodes TEP1, TEP2, TEP3, TEP4, TEP5, and TEP6 connected to the respective one of the driving groups TG1, TG2, TG3, TG4, TG5, and TG6, Cp7 denotes the seventh parasitic capacitance of the seventh driving group TG7, Cpn denotes the parasitic capacitance of each of the driving groups TG1, TG2, TG3, TG4, TG5, and TG6, and Ctn denotes a capacitance equal to the sum of the parasitic capacitance of each of the driving groups TG1, TG2, TG3, TG4, TG5, and TG6 and the compensation capacitance of the respective one of the driving peripheral electrodes TEP1, TEP2, TEP3, TEP4, TEP5, and TEP6 connected to the driving groups TG1, TG2, TG3, TG4, TG5, and TG6.

As used herein, the phrase that the first to sixth capacitance values CT1, CT2, CT3, CT4, CT5, and CT6 are substantially equal to the seventh parasitic capacitance value Cp7 means that the values are equal to the seventh parasitic capacitance value Cp7 or are greater than 95% of the seventh parasitic capacitance value Cp7 but do not exceed the seventh parasitic capacitance value Cp7. Accordingly, the load of each of the first to sixth driving groups TG1, TG2, TG3, TG4, TG5, and TG6 may be smaller than the load of the seventh driving group TG7. That is to say, the seventh driving group TG7 has the largest load, and the difference between the load of each of the first to sixth driving groups TG1, TG2, TG3, TG4, TG5, and TG6 and the load of the seventh driving group TG7 can be reduced without the load of each of the first to sixth driving groups TG1, TG2, TG3, TG4, TG5, and TG6 being larger than the load of the seventh driving group TG7.

As shown in FIGS. 7, 8, and 9, since the seventh parasitic capacitance value Cp7 of the seventh driving group TG7 has the largest value, the first to sixth driving groups TG1, TG2, TG3, TG4, TG5, and TG6, except the seventh driving group TG7, may be connected to the driving peripheral electrodes TEP1, TEP2, TEP3, TEP4, TEP5, and TEP6 overlapping the auxiliary electrodes AE, respectively. Accordingly, the first to sixth driving groups TG1, TG2, TG3, TG4, TG5, and TG6 may have the capacitance values CT1, CT2, CT3, CT4, CT5, and CT6, which are the sums of the parasitic capacitance values Cp1, Cp2, Cp3, Cp4, Cp5, and Cp6 and the compensation capacitance values Cs1, Cs2, Cs3, Cs4, Cs5, and Cs6, respectively. Therefore, the difference between the parasitic capacitance of the seventh driving group TG7 and the capacitance of each of the first to sixth driving groups TG1, TG2, TG3, TG4, TG5, and TG6 can be minimized or reduced. Accordingly, it is possible to prevent a difference in the touch sensing signal due to a difference in parasitic capacitance depending on the areas of the driving groups. Accordingly, it is possible to increase the accuracy of touch sensing.

FIG. 10 shows an example of detecting a touch by mutual capacitance sensing. FIG. 10A is a circuit diagram showing touch detection of a seventh driving group. FIG. 10B is a circuit diagram showing touch detection of a first driving group.

The panel driver 20 may include a driving signal supplying unit 20a, a sensing signal receiving unit 20b, and an ADC converter 20c.

The driving signal supplying unit 20a may sequentially supply a driving signal to the driving electrodes TE. The driving signal may include a plurality of pulses. The sensing signal receiving unit 20b may sense the amount of change in the mutual capacitance Cm sensed by the sensing electrodes RE.

The sensing signal receiving unit 20b may include a first operational amplifier OP1 and a first feedback capacitor $C_{fb1}$. The first operational amplifier OP1 may include a first input terminal (−), a second input terminal (+), and an output terminal (out). The first input terminal (−) of the first operational amplifier OP1 may be connected to the sensing line RL for connecting to the sensing electrode RE, and the initialization voltage $V_{ref}$ may be supplied to the second input terminal (+). The output terminal (out) of the first operational amplifier OA1 may output the stored output voltage Vout. The first feedback capacitor $C_{fb1}$ may be connected in parallel between the first input terminal (−) and the output terminal (out) of the first operational amplifier OP1.

The ADC converter 20C may be connected to the output terminal (out) of the first operational amplifier OP1 and may convert the output voltage Vout into digital data to output it.

The touch sensing unit TSU may determine whether there is a user's touch by sensing voltages charged at the mutual capacitance Cm.

Comparing FIG. 10A with FIG. 10B, the seventh parasitic capacitance value Cp7 formed in the seventh driving group TG7 may be substantially equal to the sum of the first parasitic capacitance value Cp1 and the first compensation capacitance value Cs1 formed in the first driving group TG1.

Accordingly, although the driving groups TG1, TG2, TG3, TG4, TG5, TG6, and TG7 have different areas S11, S21, S31, S41, S51, S61, and S71, the capacitance values of the driving groups TG1, TG2, TG3, TG4, TG5, TG6, and TG7 become uniform, so that the loads of the driving groups TG1, TG2, TG3, TG4, TG5, TG6, and TG7, i.e., the RC delays can become uniform. Therefore, the amount of change in the mutual capacitance Cm can be recognized more precisely. This can contribute to increasing the accuracy of touch sensing by the touch sensing unit TSU.

Referring to FIGS. 11, 12, 13, 14, and 15, an enlarged plan view and a cross-sectional view of the plan view of FIG. 3 will be described in terms of area and compensation of capacitance deviations.

Figure 11:
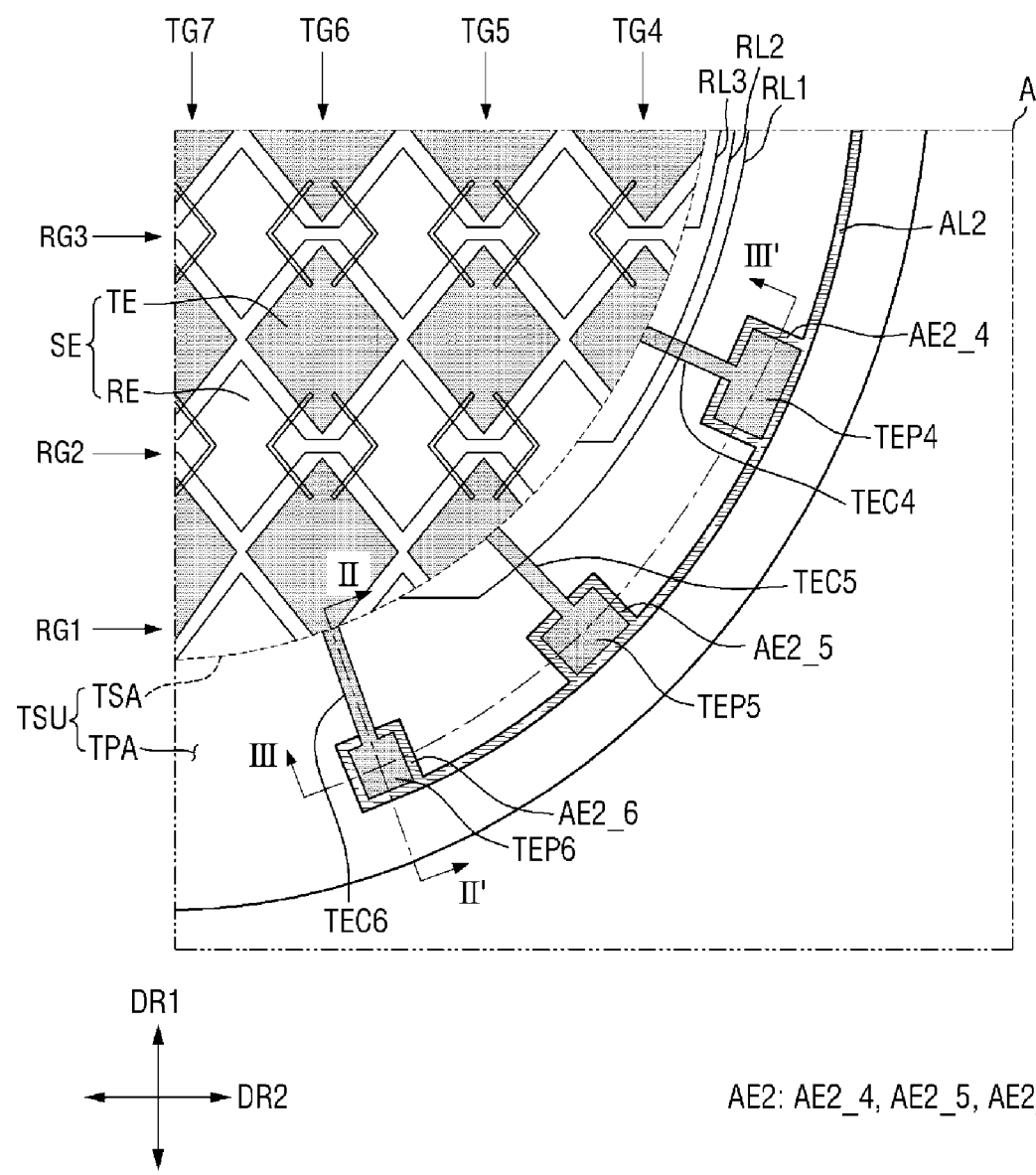
FIG. 11 is an enlarged plan view showing area A of FIG. 3.
Figure 12:
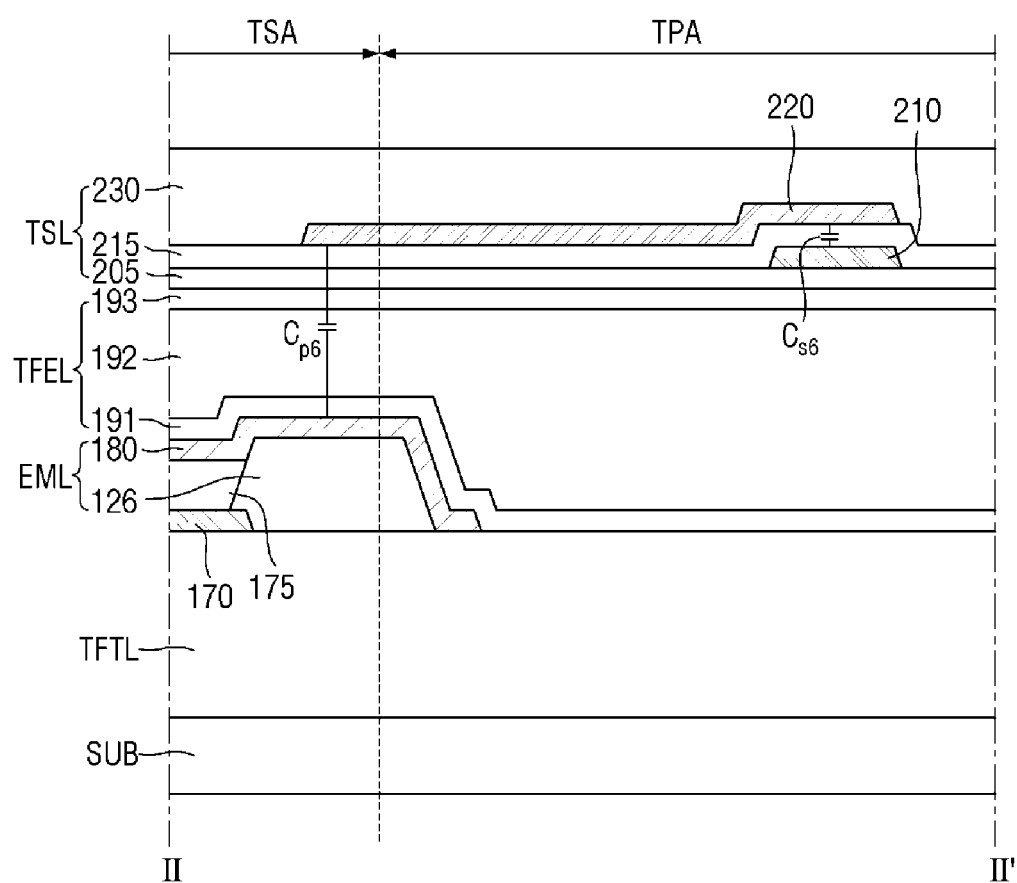
FIG. 12 is a cross-sectional view taken along line II-II' of FIG. 11.
Figure 13:
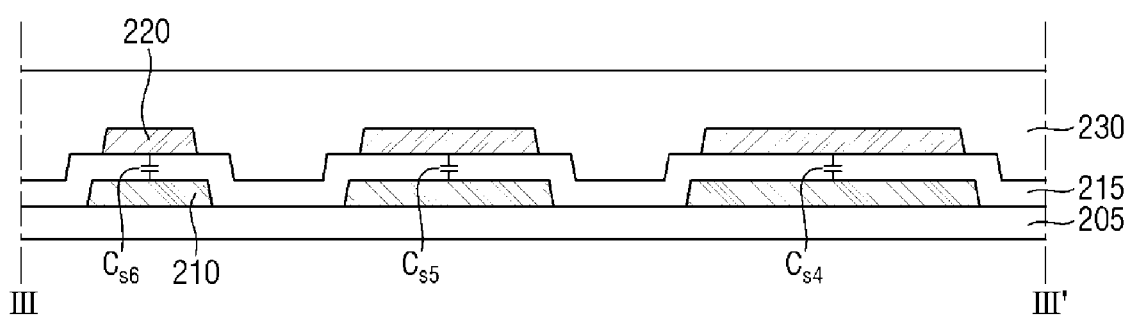
FIG. 13 is a cross-sectional view taken along line III-III' of FIG. 11.
Figure 14:
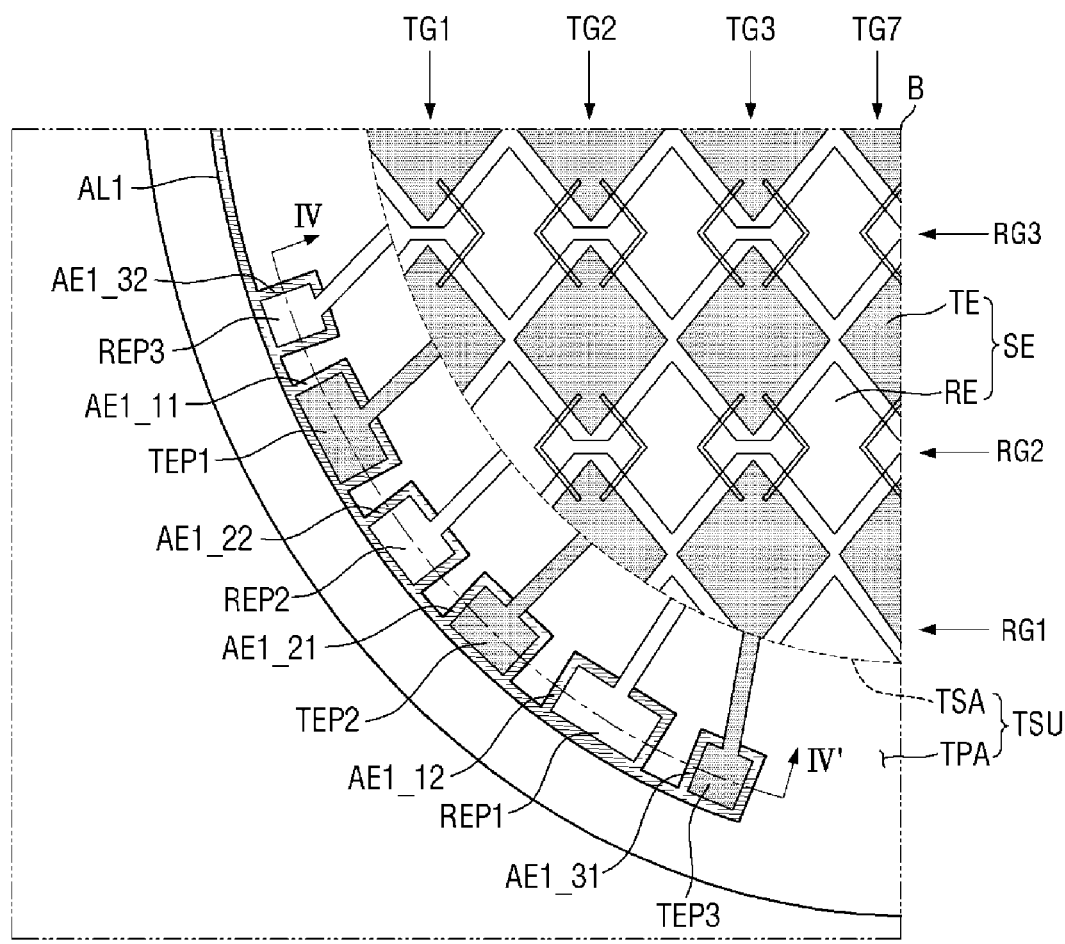
FIG. 14 is an enlarged plan view showing area B of FIG. 3.
Figure 15:
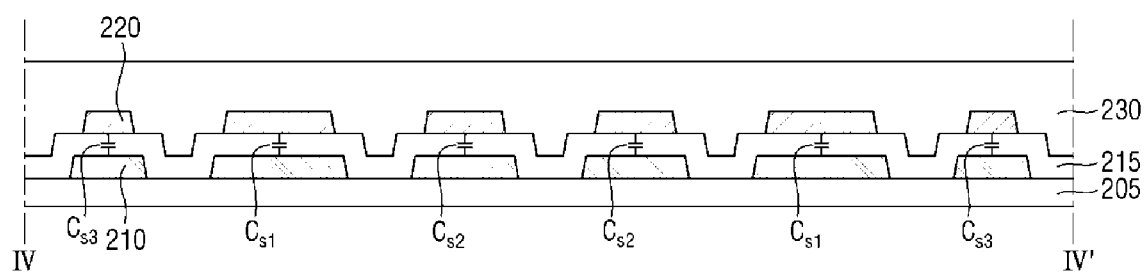
FIG. 15 is a cross-sectional view taken along line IV-IV' of FIG. 14.

FIG. 11 is an enlarged plan view showing area A of FIG. 3. FIG. 12 is a cross-sectional view taken along line II-II' of FIG. 11. FIG. 13 is a cross-sectional view taken along line III-III' of FIG. 11. FIG. 14 is an enlarged plan view showing area B of FIG. 3. FIG. 15 is a cross-sectional view taken along line IV-IV' of FIG. 14.

Referring to FIGS. 11, the fourth driving group TG4 may be electrically connected to the fourth driving peripheral electrode TEP4, the fifth driving group TG5 may be electrically connected to the fifth driving peripheral electrode TEP5, and the sixth driving group TG6 may be electrically connected to the sixth driving peripheral electrode TEP6.

In this instance, the touch sensing unit TSU may include a plurality of connecting electrodes SEC including driving electrodes TEC and sensing connecting electrodes REC. The plurality of connecting electrodes SEC may include a plurality of driving connecting electrodes TEC1, TEC2, TEC3, TEC4, TEC5, and TEC6 connected to the first to sixth driving groups TG1, TG2, TG3, TG4, TG5, and TG6, and a plurality of sensing connecting electrodes (not shown) connected to the first to sixth sensing groups RG1, RG2, RG3, RG4, RG5, and RG6.

For example, the fourth to sixth driving connecting electrodes TEC4, TEC5, and TEC6 may be disposed in the touch peripheral area TPA, and may electrically connect the ends of the driving electrodes TE included in the fourth to sixth driving groups TG4, TG5, and TG6 except the seventh driving group TG7 with the fourth to sixth driving peripheral electrodes TEP4, TEP5, and TEP6.

Among the plurality of driving connecting electrodes TEC1, TEC2, TEC3, TEC4, TEC5, and TEC6, the fourth driving connecting electrode TEC4 may overlap at least two sensing lines RL, and the fifth driving connecting electrode TEC5 may overlap at least one sensing line RL. The sixth driving connecting electrode TEC6 may not overlap sensing line RL.

The fourth to sixth driving peripheral electrodes TEP4, TEP5, and TEP6 may overlap the plurality of second auxiliary electrodes AE2_4, AE2_5, and AE2_6 connected to the second auxiliary line AL2 in the thickness direction.

Referring to FIG. 12, the cathode electrode 180 may be disposed in the touch sensing area TSA overlapping the display area DA and may be partially disposed in the touch peripheral area TPA overlapping the non-display area NDA only within a limited range.

According to the embodiment of the disclosure, the first and second auxiliary lines AL1 and AL2 and the first and second auxiliary electrodes AE1 and AE2 are formed as the first touch conductive layer 210, and the first to third driving peripheral electrodes TEP1, TEP2, and TEP3 may be formed as the second touch conductive layer 220. It should be understood, however, that the disclosure is not limited thereto. The first to third driving peripheral electrodes TEP1, TEP2, and TEP3 may be formed as the first touch conductive layer 210, and the first and second auxiliary lines AL1 and AL2 and the first and second auxiliary electrodes AE1 and AE2 may be formed as the second touch conductive layer 220.

According to the embodiment of the disclosure, the second touch conductive layer 220 may form the sixth parasitic capacitance value Cp6 with the cathode electrode 180 in the touch sensing area TSA, which is proportional to the area where they overlap each other, and the second touch conductive layer 220 may form the sixth compensation capacitance value Cs6 with the first touch conductive layer 210 in the touch peripheral area TPA, which is proportional to the area where they overlap each other. That is, the sixth capacitance value CT6 of the sixth driving group TG6 may be substantially equal to the seventh parasitic capacitance value Cp7 of the seventh driving group TG7.

Accordingly, even though the sixth driving group TG6 has an area different from that of the seventh driving group TG7, the capacitance values of the sixth driving group TG6 and the seventh driving group TG7 can become uniform.

Referring to FIG. 13, the fourth driving peripheral electrode TEP4 may overlap the second auxiliary electrode AE2_4 among the plurality of second auxiliary electrodes AE2_4, AE2_5, and AE2_6 to form the fourth compensation capacitance value Cs4, the fifth driving peripheral electrode TEP5 may overlap the second auxiliary electrode AE2_5 to form the fifth compensation capacitance value Cs5, and the sixth driving peripheral electrode TEP6 may overlap the second auxiliary electrode AE2_6 to form the sixth compensation capacitance value Cs6.

Referring to FIGS. 14 and 15, the first to third driving peripheral electrodes TEP1, TEP2, and TEP3 and the first to third sensing peripheral electrodes REP1, REP2, and REP3 may be alternately arranged in the touch peripheral area TPA. The first driving peripheral electrode TEP1, the second sensing peripheral electrode REP2, the second driving peripheral electrode TEP2, the first sensing peripheral electrode REP1 and the third driving peripheral electrode TEP3 may be arranged in the counterclockwise direction, from the third sensing peripheral electrode REP3 disposed on the left side.

For example, the first sensing peripheral electrode REP1 may be disposed between the second driving peripheral electrode TEP2 and the third driving peripheral electrode TEP3, and may have an area larger than the areas S22 and S32 of the second driving peripheral electrode TEP2 and the third driving peripheral electrode TEP3. As another example, the first driving peripheral electrode TEP1 may be disposed between the second sensing peripheral electrode REP2 and the third sensing peripheral electrode REP3, and may have an area (i.e., S11) larger than the areas of the second sensing peripheral electrode REP2 and the third sensing peripheral electrode REP3.

These may overlap the first auxiliary electrodes AE1_11, AE1_21, AE1_31, AE1_12, AE1_22, and AE1_32, which are connected by the first auxiliary line AL1 in the thickness direction to form compensation capacitors.

According to an embodiment of the disclosure, the first to sixth driving peripheral electrodes TEP1, TEP2, TEP3, TEP4, TEP5, and TEP6 may be formed in a planar pattern. When the first to sixth driving peripheral electrodes TEP1, TEP2, TEP3, TEP4, TEP5, and TEP6 are formed in a planar pattern, a considerable area can be compensated for even though they occupy a smaller area than the first to sixth driving groups TG1, TG2, TG3, TG4, TG5, and TG6. It should be understood, however, that the disclosure is not limited thereto. The first to sixth driving peripheral electrodes TEP1, TEP2, TEP3, TEP4, TEP5, and TEP6 may be formed in a mesh pattern.

Hereinafter, touch sensing units and display devices according to other embodiments of the disclosure will be described. In the following description, the same or similar elements will be denoted by the same or similar reference numerals, and redundant descriptions will be omitted or briefly described.

Figure 16:
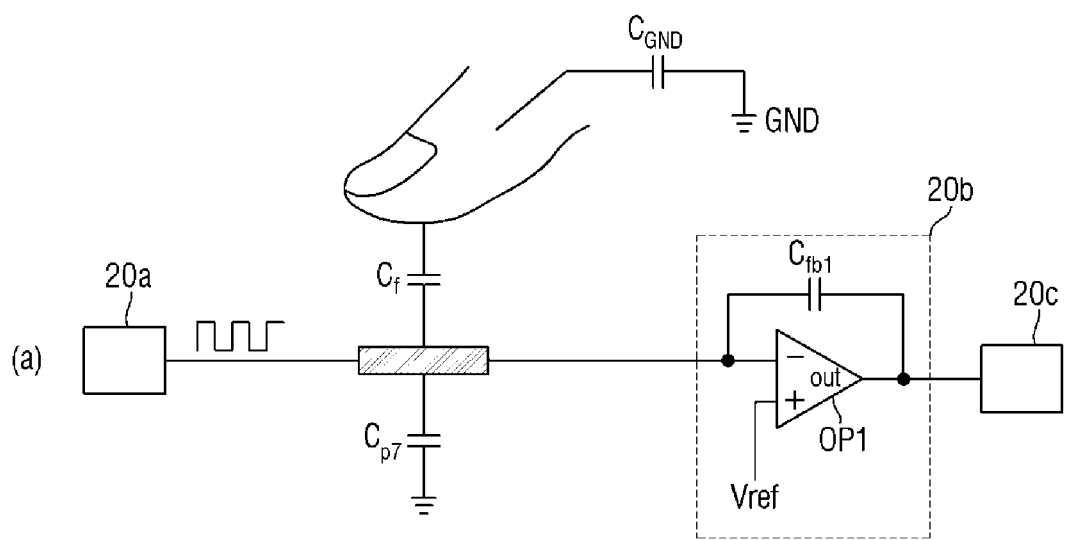
FIG. 16 is a circuit diagram showing a touch detection scheme that reflects capacitance compensation of sensor groups in a touch sensing unit according to another embodiment.
Figure 16:
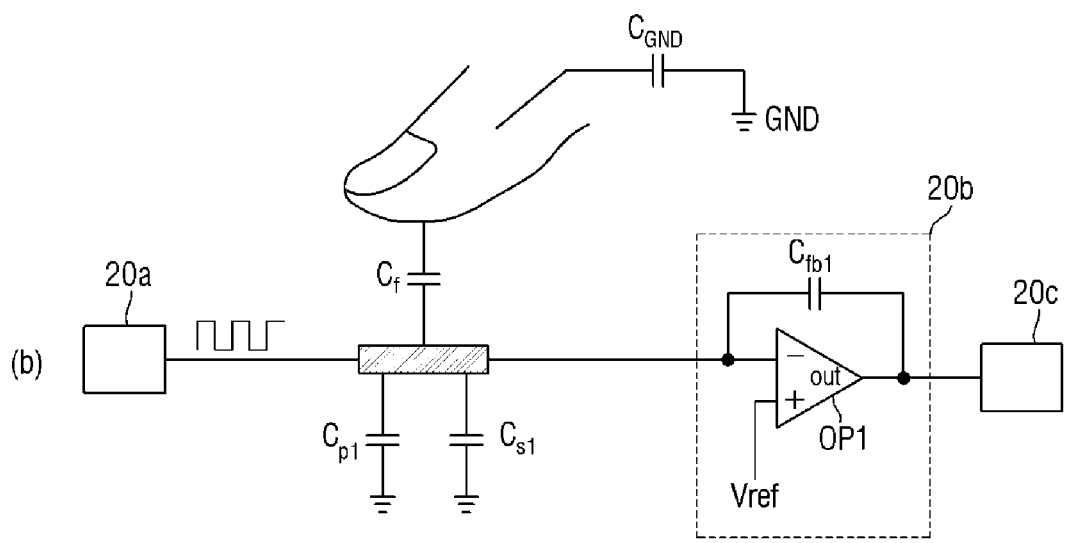

FIG. 16 is a circuit diagram showing a touch detection scheme that reflects capacitance compensation of sensor groups in a touch sensing unit according to another embodiment.

FIG. 16 shows an example of detecting a touch by self-capacitance sensing. FIG. 16A is a circuit diagram showing a touch detection scheme of a seventh sensor group. FIG. 16B is a circuit diagram showing a touch detection scheme of a first sensor group.

When the sensor electrodes SE are driven by self-capacitance sensing, each of the sensor electrodes SE may be used as a sensing electrode RE. By supplying driving signals to all of the driving electrodes TE and the sensing electrodes RE through the driving lines TL and the sensing lines RL, the self-capacitances of the driving electrodes TE and the sensing electrodes RE are charged. Then, the amount of change in the charges of the driving electrodes TE and the sensing electrodes RE are measured through the driving lines TL and the sensing lines RL, and it is determined whether a touch input is made based on the amount of change in the charges of the self-capacitances. The capacitance of each of the sensing groups RG1, RG2, RG3, RG4, RG5, RG6, and RG7 changes as much as the capacitance value $C_f$ of the finger, and the sensed amount of change in the charges is amplified for accurate sensing of a touch input.

If the seventh parasitic capacitance value Cp7 of the seventh sensing group RG7 is greater than the capacitance values CT1, CT2, CT3, CT4, CT5, and CT6 of the first to sixth sensing groups RG1, RG2, RG3, RG4, RG5, and RG6, the sensed amount of change in the charges cannot be amplified sufficiently within the maximum output voltage of the first operational amplifier OP1. Accordingly, even though the sensed amount of change in the charges is amplified, the difference in the amount of change in the charges due to the capacitance value $C_f$ of the finger may be too small. As a result, a users touch may not be sensed, or a touch may be recognized erroneously even though there was not any.

In contrast, according to the embodiment of the disclosure, the capacitance values CT1, CT2, CT3, CT4, CT5, and CT6 of the first to sixth sensing groups RG1 to RG6 can be substantially equal to the seventh parasitic capacitance value Cp7 of the seventh sensing group RG7 by virtue of the sensing peripheral electrodes REP1, REP2, REP3, REP4, REP5, and REP6 and the auxiliary electrodes AE overlapping them. Therefore, it is possible to amplify the capacitance values of the first to seventh sensing groups RG1, RG2, RG3, RG4, RG5, RG6, and RG7 and the capacitance value $C_f$ of the finger within the maximum output voltage of the first operational amplifier OP1. As a result, the ratio of the capacitance value $C_f$ of the finger relative to the capacitance values of the first to seventh sensing groups RG1, RG2, RG3, RG4, RG5, RG6, and RG7 in the amplified capacitance increases, so that a touch input can be sensed more accurately.

Figure 17:
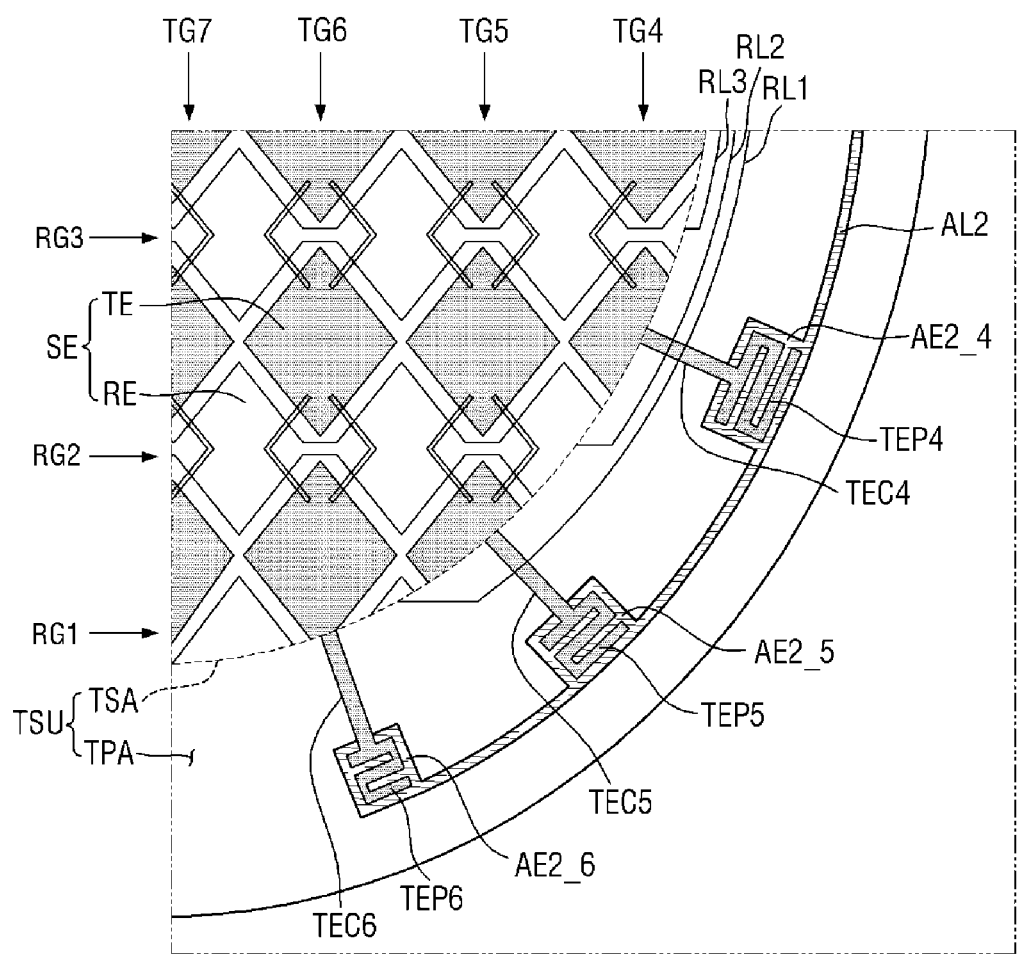
FIG. 17 is an enlarged plan view showing area A of FIG. 3 in a touch sensing unit according to another embodiment.
Figure 18:
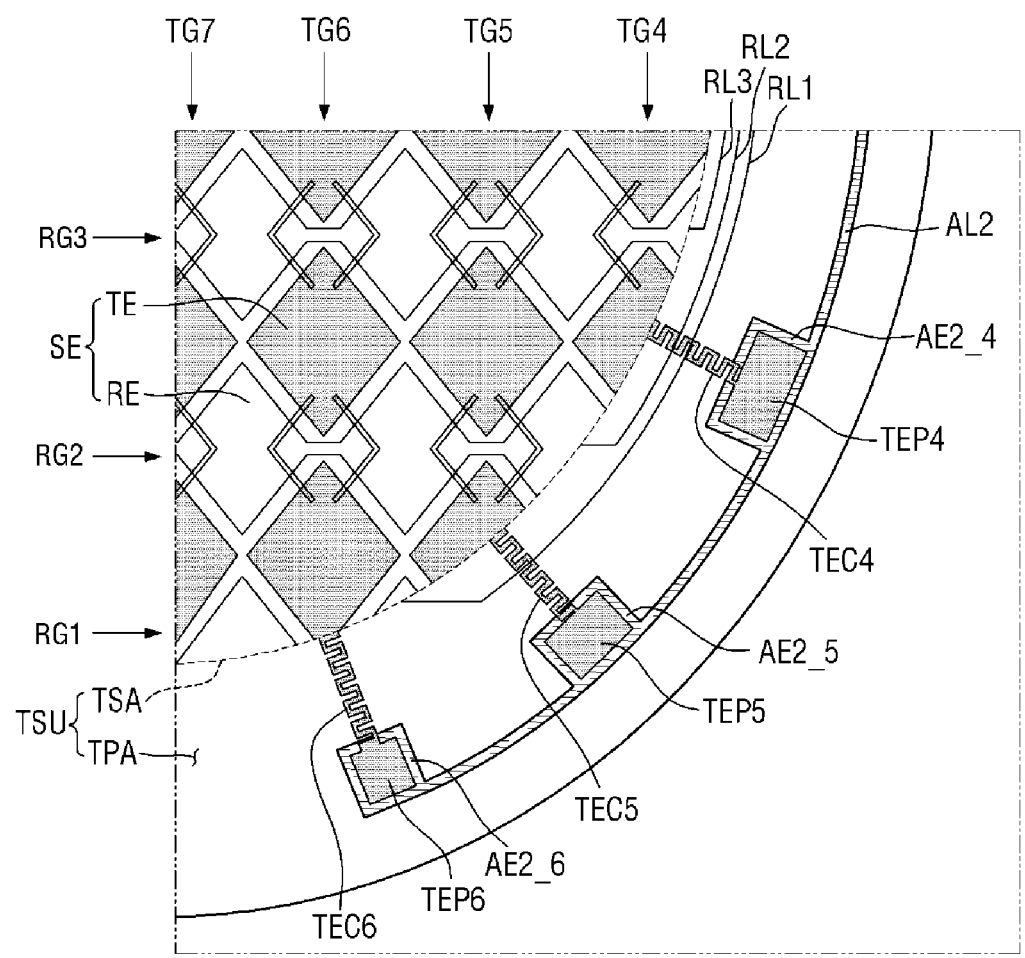
FIG. 18 is an enlarged plan view showing area A of FIG. 3 in a touch sensing unit according to yet another embodiment.

FIG. 17 is an enlarged plan view showing area A of FIG. 3 in a touch sensing unit according to another embodiment. FIG. 18 is an enlarged plan view showing area A of FIG. 3 in a touch sensing unit according to yet another embodiment.

The embodiment of FIG. 17 is different from the above-described embodiments in that first to sixth driving peripheral electrodes TEP1, TEP2, TEP3, TEP4, TEP5, and TEP6 forming first to sixth compensation capacitance values Cs1, Cs2, Cs3, Cs4, Cs5, and Cs6 are modified into a zigzag shape or a winding shape.

By changing the shape of the first to sixth driving peripheral electrodes TEP1 to TEP6 connected to the first to sixth driving groups TG1, TG2, TG3, TG4, TG5, and TG6 into a zigzag shape or a winding shape, it is possible to achieve a uniform resistance across electrodes having paths of different lengths.

Referring to FIG. 18, the fourth to sixth driving connecting electrodes TEC4, TEC5, and TEC6 connecting the fourth to sixth driving groups TG4, TG5, and TG6 with the fourth to sixth driving peripheral electrodes TEP4, TEC5, and TEP6 may be modified into a zigzag shape or a winding shape. In this manner, it is possible to achieve a uniform resistance across electrodes having different lengths.

For example, since the fourth driving group TG4 has a shorter length in the first direction DR1 than the sixth driving group TG6, the fourth driving connecting electrode TEC4 may be modified into a winding shape or a zigzag shape so that the path of the fourth driving connecting electrode TEC4 is longer than the path of the sixth driving connecting electrode TEC6. By doing so, the RC load of the fourth driving group TG4 may be substantially equal to the RC load of the sixth driving group TG6.

As such, by extending the driving peripheral electrodes TEP or the driving connecting electrodes TEC in a zigzag shape or a winding shape, the electrodes having the path of different lengths can become uniform, so that the loads between the driving electrodes, i.e., RC delays, can become substantially all equal. In addition, although not shown in the drawings, it is to be understood that the sensing peripheral electrodes REP and the sensing connecting electrodes REC may be equally modified.

Figure 19:
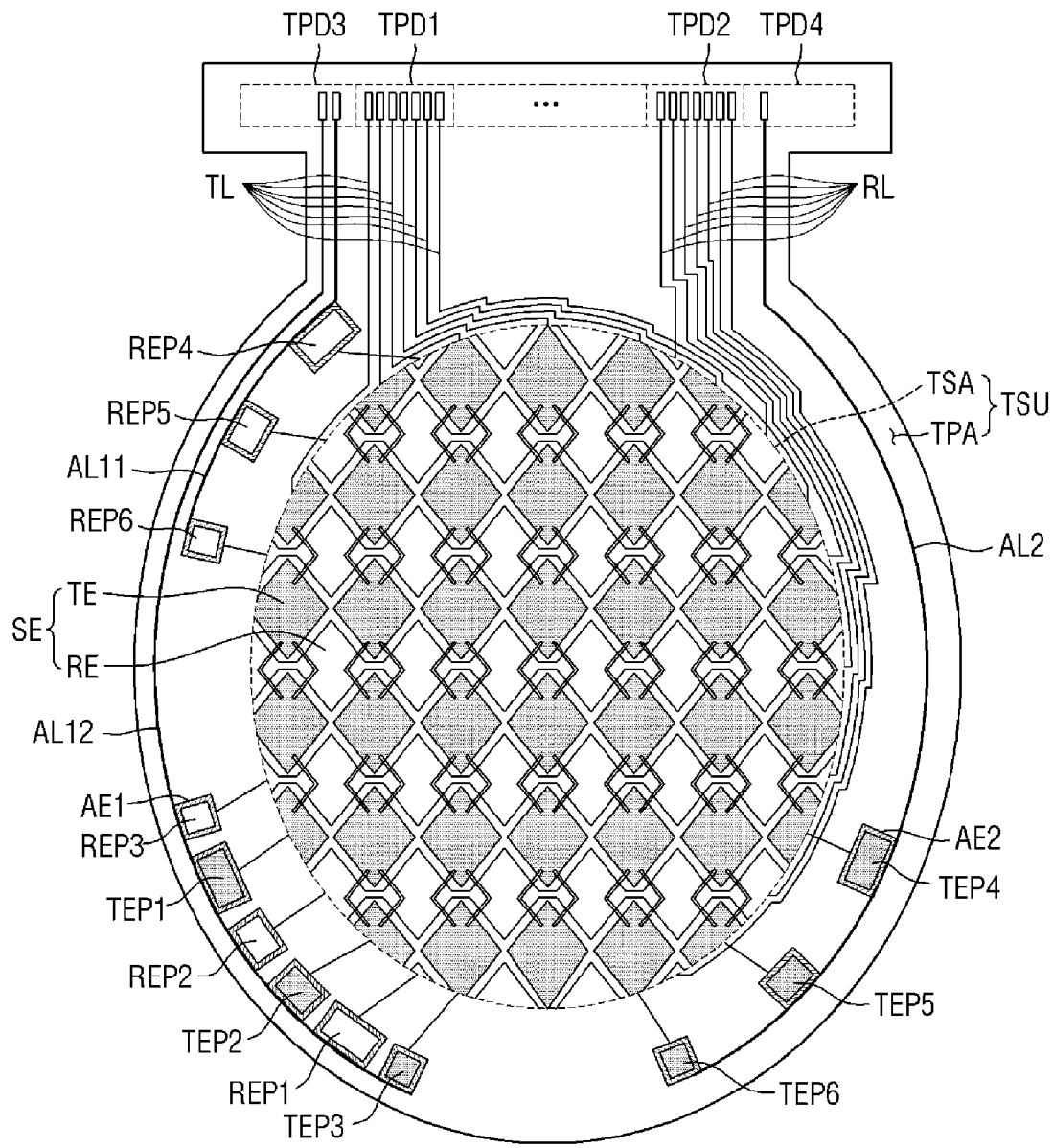
FIG. 19 is a plan view of a display panel according to another embodiment of the disclosure.
Figure 20:
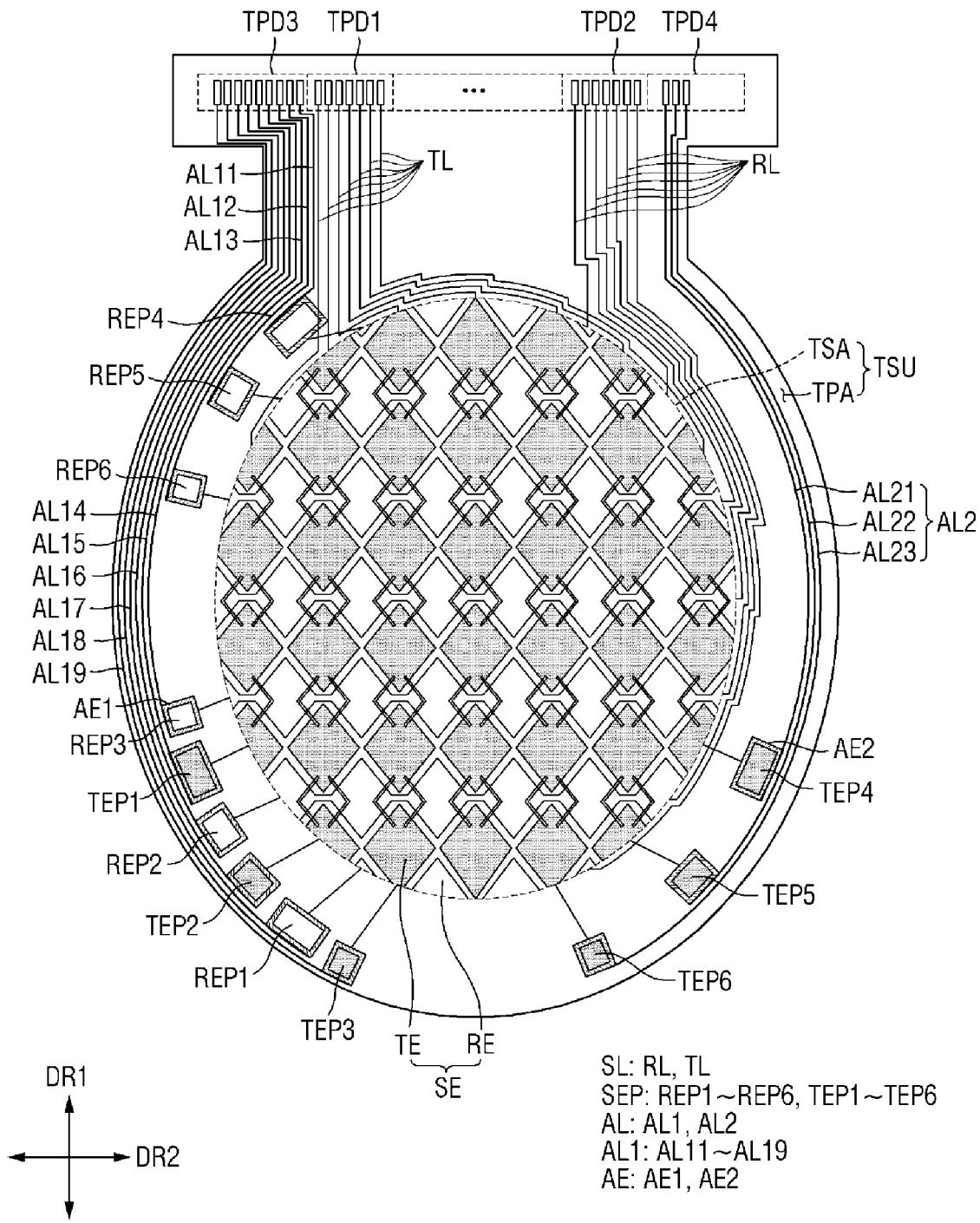
FIG. 20 is a plan view of a display panel according to yet another embodiment of the disclosure.

FIG. 19 is a plan view of a display panel according to another embodiment of the disclosure. FIG. 20 is a plan view of a display panel according to yet another embodiment of the disclosure. The embodiments of FIGS. 19 and 20 are different from the above-described embodiments in that the first auxiliary line AL1 and the second auxiliary line AL2 are added.

FIG. 19 shows an example where a plurality of first auxiliary lines AL1 is disposed. The plurality of first auxiliary lines AL1 including a first-first auxiliary line AL11 and a first-second auxiliary line AL12 may be extended from the third touch pad area TPD3 and be disposed along the left edge. The first-first auxiliary line AL11 is connected to the plurality of first auxiliary electrodes AE1 overlapping the fourth to sixth sensing peripheral electrodes REP4, REP5, and REP6, and the first-second auxiliary line AL12 is connected to the plurality of first auxiliary electrodes AE1 overlapping the first to third sensing peripheral electrodes REP1, REP2, and REP3 and the first to third driving peripheral electrodes TEP1, TEP2, and TEP3. Although two first auxiliary lines AL1 and AL2 are disposed in FIG. 19, two or more first auxiliary lines may be disposed so that they are connected to the plurality of first auxiliary electrodes AE1, respectively.

In the example shown in FIG. 20, a plurality of first auxiliary lines AL1 and a plurality of second auxiliary lines AL2 are disposed. The plurality of first auxiliary lines AL1 including a first-first auxiliary line to a first-ninth auxiliary line AL11, AL12, AL13, AL14, AL15, AL16, AL17, AL18 and AL19 may be extended from the third touch pad area TPD3 and may be connected to the plurality of first auxiliary lines arranged along the left edge, respectively. In addition, the plurality of second auxiliary lines AL2 including a second-first auxiliary line to a third-first auxiliary line AL21, AL22 and AL23 may be extended from the fourth touch pad area TPD4 and may be connected to the plurality of second auxiliary electrodes AE2 arranged along the right edge, respectively.

That is to say, the number of the first auxiliary lines AL1 and the number of the second auxiliary lines AL2 are not limited to those in this embodiment but may be changed in a variety of ways.

Figure 21:
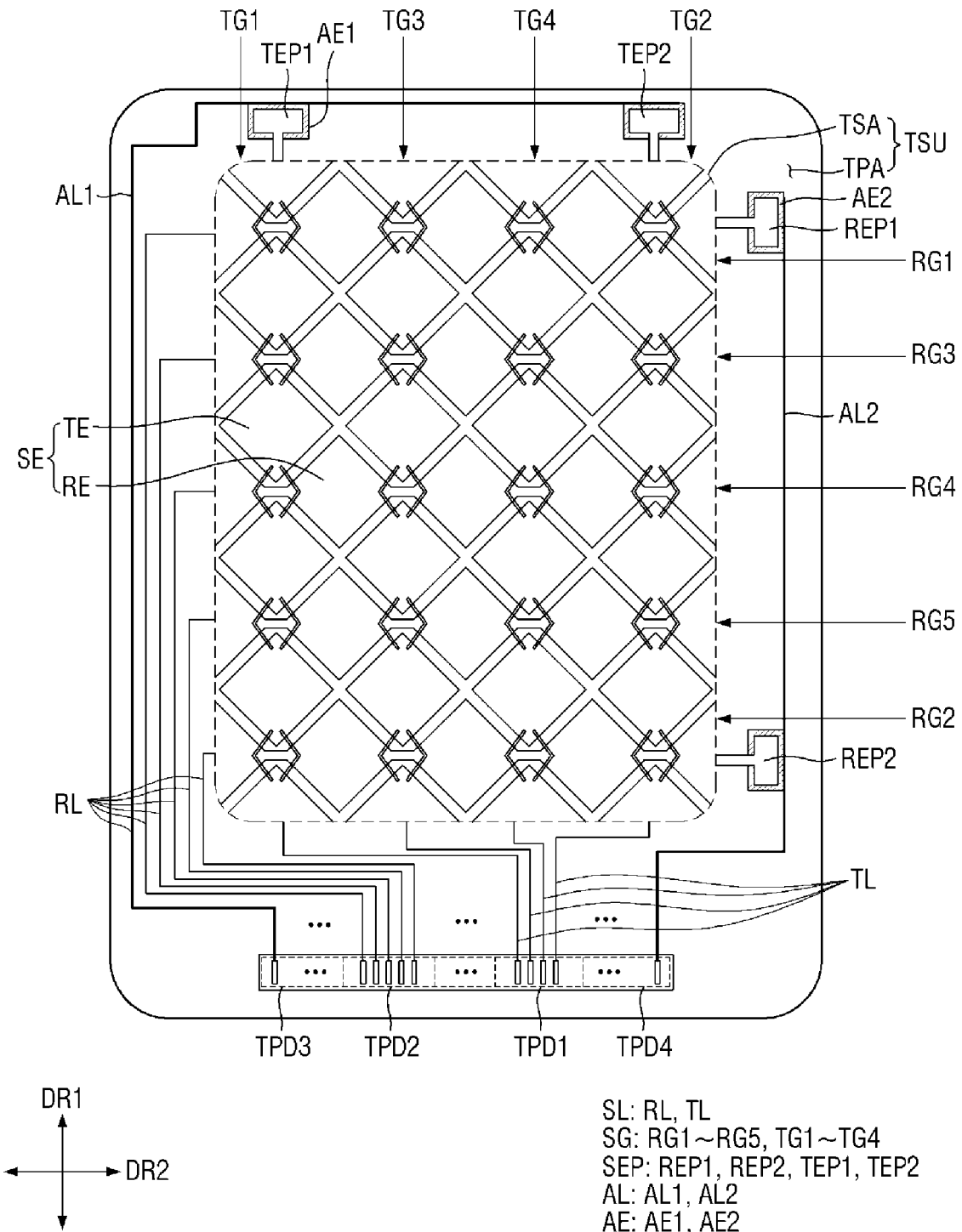
FIG. 21 is a plan view of a display panel according to yet another embodiment of the disclosure.
Figure 22:
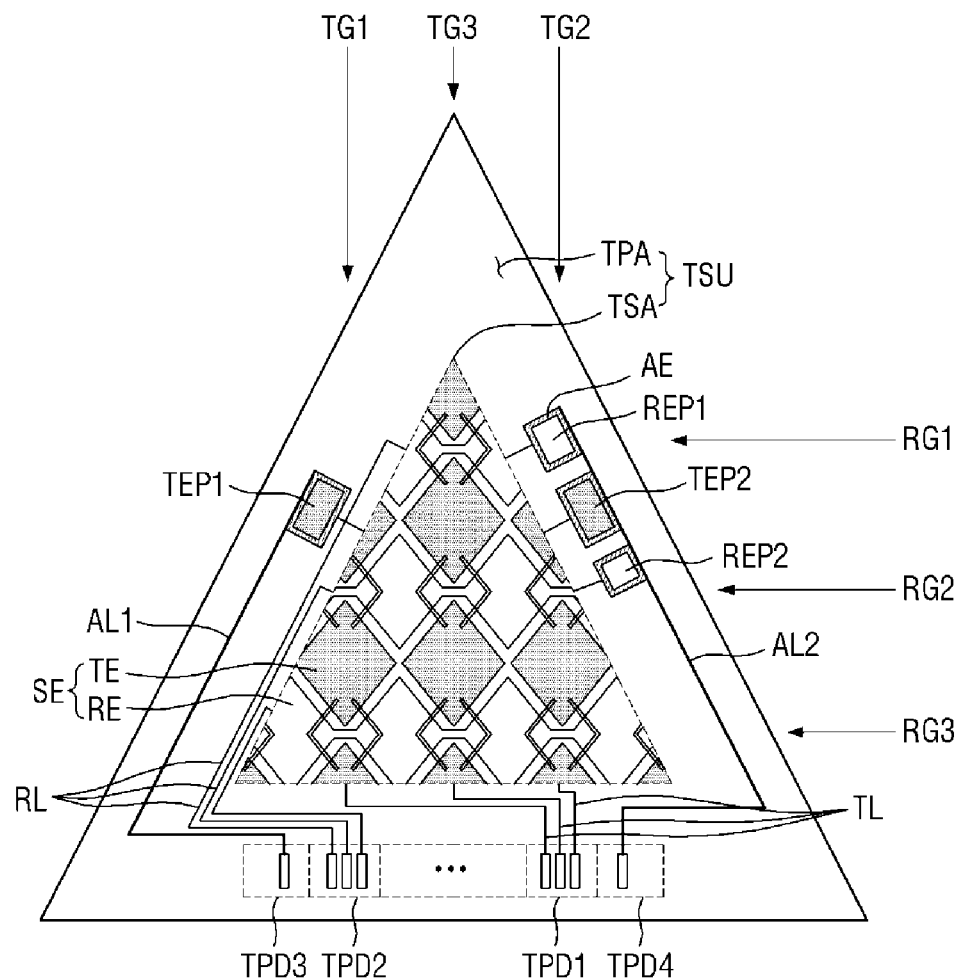
FIG. 22 is a plan view of a display panel according to yet another embodiment of the disclosure.

FIG. 21 is a cross-sectional view of a display panel according to yet another embodiment of the disclosure. FIG. 22 is a plan view of a display panel according to yet another embodiment of the disclosure. FIGS. 21 and 22 illustrate that the shapes of the display area DA and the touch sensing area TSA of the display panel 10 may be modified in a variety of ways. Like reference numerals to those used in the above-described embodiments denote like elements, and redundant descriptions of such elements will not be repeated.

Referring to FIG. 21, the display area DA and the touch sensing area TSA of the display panel 10 may have rounded corners. Even in this example of the display panel 10 with rounded corners, since the area of each of the plurality of sensor groups SG including the corners is reduced, a difference in the capacitance can be compensated for by disposing the peripheral electrodes SEP in the touch peripheral area TPA. Accordingly, it is possible to increase the accuracy of touch sensing.

The plurality of sensor groups SG may include a plurality of driving groups TG1, TG2, TG3, and TG4 and a plurality of sensing groups RG1, RG2, RG3, RG4, and RG5. In addition, the plurality of sensor lines SL may include a plurality of driving lines TL connected to the plurality of driving groups TG1, TG2, TG3, and TG4, and a plurality of sensing lines RL connected to the plurality of sensing groups RG1, RG2, RG3, RG4, and RG5.

The first driving group TG1 may be disposed on the left side of the touch sensing area TSA, and the second driving group TG2 may be disposed on the right side of the touch sensing area TSA. The third and fourth driving groups TG3 and TG4 having the largest area may be disposed between the first driving group TG1 and the second driving group TG2.

The first driving group TG1 may be electrically connected to a first driving peripheral electrode TEP1 disposed in the touch peripheral area TPA, and the second driving group TG2 may be electrically connected to a second driving peripheral electrode TEP2 disposed in the touch peripheral area TPA. In this manner, a difference in capacitance between the first to fourth driving groups TG1, TG2, TG3, and TG4 can be compensated for.

Therefore, although the areas of the first to fourth driving groups TG1, TG2, TG3, and TG4 are different, the capacitance values become uniform, so that the RC delays of the first to fourth driving groups TG1, TG2, TG3, and TG4 can become uniform. As a result, it is possible to increase the accuracy of touch sensing.

Similarly, the first sensing group RG1 may be disposed on the upper side of the touch sensing area TSA, and the second sensing group RG2 may be disposed on the lower side of the touch sensing area TSA. The third to fifth sensing groups RG3, RG4, and RG5 having the largest area may be disposed between the first sensing group RG1 and the second sensing group RG2.

The first sensing group RG1 may be electrically connected to a first sensing peripheral electrode REP1 disposed in the touch peripheral area TPA, and the second sensing group RG2 may be electrically connected to a second sensing peripheral electrode REP2 disposed in the touch peripheral area TPA. In this manner, a difference in capacitance between the first to fifth sensing groups RG1, RG2, RG3, RG4, and RG5 can be compensated for.

Therefore, although the areas of the first to fifth sensing groups RG1, RG2, RG3, RG4, and RG5 are different, the capacitance values become uniform, so that the RC delays of the first to fifth sensing groups RG1, RG2, RG3, RG4, and RG5 can become uniform. As a result, it is possible to increase the accuracy of touch sensing.

Referring to FIG. 22, a display area DA and a touch sensing area TSA of a display panel 10 may have a triangular shape when viewed from the top. Even in this example of the display panel 10 in a triangular shape, since different sensor groups SG have different areas, a difference in the capacitance can be compensated for by disposing the peripheral electrodes SEP in the touch peripheral area TPA.

For example, the plurality of sensor groups SG may include a plurality of driving groups TG1, TG2, and TG3 and a plurality of sensing groups RG1, RG2, and RG3. In addition, the plurality of sensor lines SL may include a plurality of driving lines TL connected to the plurality of driving groups TG1, TG2, and TG3, and a plurality of sensing lines RL connected to the plurality of sensing groups RG1, RG2, and RG3.

The first driving group TG1 may be disposed on the left side of the touch sensing area TSA, and the second driving group TG2 may be disposed on the right side of the touch sensing area TSA. The third driving groups TG3 having the largest area may be disposed between the first driving group TG1 and the second driving group TG2.

The first driving group TG1 may be electrically connected to a first driving peripheral electrode TEP1 disposed in the touch peripheral area TPA, and the second driving group TG2 may be electrically connected to a second driving peripheral electrode TEP2 disposed in the touch peripheral area TPA. In this manner, a difference in capacitance between the first to third driving groups TG1, TG2, and TG3 can be compensated for.

Similarly, the first sensing group RG1 may be disposed on the upper side of the touch sensing area TSA, and the second sensing group RG2 may be disposed on the lower side of the first sensing group RG1. The third sensing group RG3 having the largest area may be disposed on the lower side of the first sensing group RG1 and the second sensing group RG2, i.e., at the lowermost position of the touch sensing area TSA.

The first sensing group RG1 may be electrically connected to a first sensing peripheral electrode REP1 disposed in the touch peripheral area TPA, and the second sensing group RG2 may be electrically connected to a second sensing peripheral electrode REP2 disposed in the touch peripheral area TPA. In this manner, a difference in capacitance between the first to third sensing groups RG1, RG2, and RG3 can be compensated for.

Accordingly, although the sensor groups GS have different areas, the capacitance values are formed uniformly, so that it is possible to increase the accuracy of touch sensing.

Features of various embodiments of the disclosure may be combined partially or totally. As will be clearly appreciated by those skilled in the art, technically various interactions and operations are possible. Various embodiments can be practiced individually or in combination.

In concluding the detailed description, those skilled in the art will appreciate that many variations and modifications can be made to the preferred embodiments without substantially departing from the principles of the disclosure. Therefore, the disclosed preferred embodiments of the disclosure are used in a generic and descriptive sense only and not for purposes of limitation.

What is claimed is:

1. A touch sensing unit comprising:
   a first sensor group extending in a first direction and including a first plurality of sensor electrodes;
   a second sensor group extending in the first direction and including a second plurality of sensor electrodes;
   a first peripheral electrode electrically connected to the first sensor group;
   a second peripheral electrode electrically connected to the second sensor group;

a plurality of sensing lines surrounding the first sensor group and the second sensor group, a plurality of connecting electrodes connecting the first sensor group with the first peripheral electrode, wherein an area of the first sensor group is smaller than an area of the second sensor group in a plan view, wherein an area of the first peripheral electrode is greater than an area of the second peripheral electrode in the plan view, wherein at least one of the connecting electrodes overlaps at least two of the sensing lines in a thickness direction, and one of the at least two of the sensing lines does not overlap another of the at least two of the sensing lines.

2. The touch sensing unit of claim 1, further comprising:
a plurality of auxiliary electrodes overlapping the first peripheral electrode and the second peripheral electrode; and
an auxiliary line connecting to at least one of the plurality of auxiliary electrodes.

3. The touch sensing unit of claim 2, further comprising:
a third sensor group extending in the first direction and including a third plurality of sensor electrodes; and
a third peripheral electrode electrically connected to the third sensor group,
wherein the area of the second sensor group is smaller than an area of the third sensor group in the plan view, and
wherein the area of the second peripheral electrode is larger than an area of the third peripheral electrode in the plan view.

4. The touch sensing unit of claim 1, further comprising:
a third sensor group extending in the first direction, including a third plurality of sensor electrodes, and having a largest area, and
wherein a number of a plurality of peripheral electrodes including the first peripheral electrode and the second peripheral electrode is less than a number of the plurality of sensor groups comprising the first sensor group, the second sensor group and the third sensor group in the plan view.

5. The touch sensing unit of claim 1, wherein a length of the second sensor group in the first direction is larger than a length of the first sensor group in the first direction.

6. The touch sensing unit of claim 3, comprising:
a touch sensing area in which the first sensor group and the second sensor group are disposed; and
a touch peripheral area in which the first peripheral electrode, the second peripheral electrode, the plurality of auxiliary electrodes, and the auxiliary line are disposed.

7. The touch sensing unit of claim 2, wherein the auxiliary line is connected to all of the plurality of auxiliary electrodes.

8. The touch sensing unit of claim 2, wherein the auxiliary line comprises:
a first auxiliary line connected to one of the plurality of auxiliary electrodes which overlaps the first peripheral electrode; and
a second auxiliary line connected to one of the plurality of auxiliary electrodes which overlaps the second peripheral electrode.

9. The touch sensing unit of claim 2,
wherein the connecting electrodes comprises:
a first connecting electrode connecting the first sensor group with the first peripheral electrode; and a second connecting electrode connecting the second sensor group with the second peripheral electrode, and
wherein a length of the first connecting electrode is longer than a length of the second connecting electrode.

10. The touch sensing unit of claim 2, wherein at least one of the first peripheral electrode and the second peripheral electrode is disposed in a winding shape.

11. The touch sensing unit of claim 1, wherein each of the first sensor group and the second sensor group includes a plurality of sensor electrodes having a mesh shape, and
wherein the first peripheral electrode and the second peripheral electrode have a planar shape.

12. A touch sensing unit comprising:
a first driving group including a plurality of driving electrodes extending in a first direction;
a first sensing group including a plurality of sensing electrodes extending in a second direction crossing the first direction;
a plurality of sensing lines surrounding the first driving group and the first sensing group;
a first driving peripheral electrode electrically connected to the first driving group;
a first sensing peripheral electrode electrically connected to the first sensing group;
a plurality of auxiliary electrodes overlapping the first driving peripheral electrode and the first sensing peripheral electrode;
a first auxiliary line connected to at least one of the plurality of auxiliary electrodes, and
a plurality of connecting electrodes connecting the first driving group with the first sensing peripheral electrode,
wherein at least one of the connecting electrodes overlaps two of the sensing lines in a thickness direction, and
one of the at least two of the sensing lines does not overlap another of the at least two of the sensing lines.

13. The touch sensing unit of claim 12, further comprising:
a second auxiliary line connected to at least another one of the plurality of auxiliary electrodes.

14. The touch sensing unit of claim 12, comprising:
a touch sensing area in which the first driving group and the first sensing group are disposed; and
a touch peripheral area in which a first peripheral electrode, the first sensing peripheral electrode, and the first auxiliary line are disposed.

15. The touch sensing unit of claim 14,
wherein the touch sensing area includes a second driving group extending in the first direction and having a second plurality of driving electrodes, and a second sensing group extending in the second direction and comprising a second plurality of sensing electrodes,
wherein the touch peripheral area includes a second driving peripheral electrode electrically connected to the second driving group, and a second sensing peripheral electrode electrically connected to the second sensing group,
wherein an area of the second driving group is larger than an area of the first driving group, and an area of the second sensing group is larger than an area of the first sensing group in a plan view, and
wherein an area of the second driving peripheral electrode is smaller than an area of the first driving peripheral electrode, and an area of the second sensing peripheral electrode is smaller than an area of the first sensing peripheral electrode in the plan view.

16. The touch sensing unit of claim 15, comprising:

a third sensing group extending in the second direction and including a third plurality of sensing electrodes; and a third sensing peripheral electrode electrically connected to the third sensing group, wherein an area of the third sensing group is greater than an area of the second sensing group, and an area of the third sensing peripheral electrode is smaller than an area of the second sensing peripheral electrode, and wherein the first driving peripheral electrode is disposed between the third sensing peripheral electrode and the second sensing peripheral electrode.

17. A display device comprising:

a substrate including a touch sensing area having a circular shape and a touch peripheral area disposed around the touch sensing area;

an anode electrode disposed on the substrate;

a pixel-defining film having an opening exposing the anode electrode;

an emission layer disposed in the opening of the pixel-defining film on the anode electrode;

a cathode electrode disposed on the emission layer;

an encapsulation layer disposed on the cathode electrode;

a first touch conductive layer disposed on the encapsulation layer;

a first touch insulating layer disposed on the first touch conductive layer; and a second touch conductive layer disposed on the first touch insulating layer, wherein the first touch conductive layer includes a plurality of auxiliary electrodes disposed in the touch peripheral area, wherein the second touch conductive layer includes a first sensor group and a second sensor group having a plurality of sensor electrodes extended in a direction in the touch sensing area, and a first peripheral electrode and a second peripheral electrode overlapping the plurality of auxiliary electrodes in the touch peripheral area, wherein the first touch conductive layer and the second touch conductive layer are disposed on a different layer from the anode electrode and do not overlap the anode electrode, wherein the connecting electrodes comprises:

a first connecting electrode connecting the first sensor group with the first peripheral electrode; and a second connecting electrode connecting the second sensor group with the second peripheral electrode, and wherein a length of the first connecting electrode is longer than a length of the second connecting electrode.

18. The display device of claim 17, comprising:

an auxiliary line connecting the auxiliary electrodes with one another, wherein a voltage applied to the auxiliary line is equal to a voltage applied to the cathode electrode.

19. The display device of claim 17, comprising:

an auxiliary line connecting the auxiliary electrodes with one another, wherein a ground voltage is applied to the auxiliary line.

20. The display device of claim 17, wherein an area of the first sensor group is greater than an area of the second sensor group in a plan view, and wherein an area of the first peripheral electrode is smaller than an area of the second peripheral electrode in the plan view.

* * * * *